United States Patent
Chen et al.

(10) Patent No.: US 12,328,929 B2
(45) Date of Patent: Jun. 10, 2025

(54) METHOD OF FORMING THIN DUMMY SIDEWALL SPACERS FOR TRANSISTORS WITH REDUCED PITCHES

(71) Applicant: Taiwan Semiconductor Manufacturing Co., Ltd., Hsinchu (TW)

(72) Inventors: Wen-Ju Chen, New Taipei (TW); Chung-Ting Ko, Kaohsiung (TW); Tai-Chun Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 237 days.

(21) Appl. No.: 17/662,940

(22) Filed: May 11, 2022

(65) Prior Publication Data

US 2023/0223304 A1 Jul. 13, 2023

Related U.S. Application Data

(60) Provisional application No. 63/298,705, filed on Jan. 12, 2022.

(51) Int. Cl.
H01L 21/311 (2006.01)
H01L 29/423 (2006.01)
(Continued)

(52) U.S. Cl.
CPC ...... H10D 84/013 (2025.01); H01L 21/31116 (2013.01); H10D 30/6735 (2025.01);
(Continued)

(58) Field of Classification Search
CPC ......... H01L 21/823418; H01L 21/8234; H01L 21/31116; H01L 21/311; H01L 21/823437;
(Continued)

(56) References Cited

U.S. PATENT DOCUMENTS 9,171,716 B2    10/2015  Fukuda
9,576,814 B2 *   2/2017  Wu ................... H01L 21/30604
(Continued)

FOREIGN PATENT DOCUMENTS

CN    113764350 A    12/2021
KR    20120075397 A   7/2012
(Continued)

*Primary Examiner* — Nikolay K Yushin
(74) *Attorney, Agent, or Firm* — Slater Matsil, LLP

(57) ABSTRACT

A method includes forming a first gate stack over a first semiconductor region, depositing a spacer layer on the first gate stack, and depositing a dummy spacer layer on the spacer layer. The dummy spacer layer includes a metal-containing material. An anisotropic etching process is performed on the dummy spacer layer and the spacer layer to form a gate spacer and a dummy sidewall spacer, respectively. The first semiconductor region is etched to form a recess extending into the first semiconductor region. The first semiconductor region is etched using the first gate stack, the gate spacer, and the dummy sidewall spacer as an etching mask. The method further includes epitaxially growing a source/drain region in the recess, and removing the dummy sidewall spacer after the source/drain region is grown.

20 Claims, 32 Drawing Sheets

(51) Int. Cl.
  *H10D 30/67* (2025.01)
  *H10D 84/01* (2025.01)
  *H10D 84/03* (2025.01)

(52) U.S. Cl.
  CPC ..... *H10D 84/0135* (2025.01); *H10D 84/0147* (2025.01); *H10D 84/038* (2025.01)

(58) Field of Classification Search
  CPC ..... H01L 21/823468; H01L 21/823814; H01L 21/8238; H01L 29/42392; H01L 29/423; H01L 29/0673; H01L 29/06; H01L 29/165; H01L 29/66439; H01L 29/66469; H01L 29/66; H01L 29/78696; H01L 29/78612; H01L 29/78621; H01L 29/786; H01L 29/6653; H01L 29/66545; H01L 29/6656; H01L 29/775; H01L 29/7848; H01L 21/3086; H01L 21/308; H01L 21/823821; H01L 21/823864; H01L 27/0886; H01L 27/088; H01L 27/0924; H01L 27/0922; H01L 29/78; H01L 29/66795; B82Y 10/00; H10D 84/013; H10D 84/01; H10D 84/0135; H10D 84/0147; H10D 84/038; H10D 84/017; H10D 84/0184; H10D 84/0193; H10D 84/834; H10D 84/83; H10D 30/6735; H10D 30/67; H10D 30/014; H10D 30/01; H10D 30/43; H10D 30/6757; H10D 30/6708; H10D 30/6715; H10D 30/797; H10D 30/69; H10D 30/024; H10D 64/017; H10D 64/01; H10D 64/021; H10D 64/015; H10D 62/822; H10D 62/10; H10D 62/235; H10D 62/121; H10D 62/151

See application file for complete search history.

(56) References Cited

U.S. PATENT DOCUMENTS

| | | | |
|---|---|---|---|
| 10,062,692 B1* | 8/2018 | Ray | H01L 27/092 |
| 10,163,715 B2* | 12/2018 | Liao | H01L 29/7851 |
| 11,145,746 B2 | 10/2021 | Chen et al. | |
| 11,227,956 B2 | 1/2022 | Yeong et al. | |
| 11,530,479 B2 | 12/2022 | Ko et al. | |
| 11,728,173 B2 | 8/2023 | Chen et al. | |
| 2010/0295024 A1 | 11/2010 | Pernel et al. | |
| 2018/0151440 A1* | 5/2018 | Liao | H01L 29/0649 |
| 2018/0247936 A1* | 8/2018 | Ray | H01L 21/823814 |
| 2019/0067126 A1 | 2/2019 | Chen et al. | |

FOREIGN PATENT DOCUMENTS

| | | | |
|---|---|---|---|
| KR | 20160011126 | A | 1/2016 |
| KR | 20210086942 | A | 7/2021 |
| TW | 202117960 | A | 5/2021 |
| TW | 202133228 | A | 9/2021 |

* cited by examiner

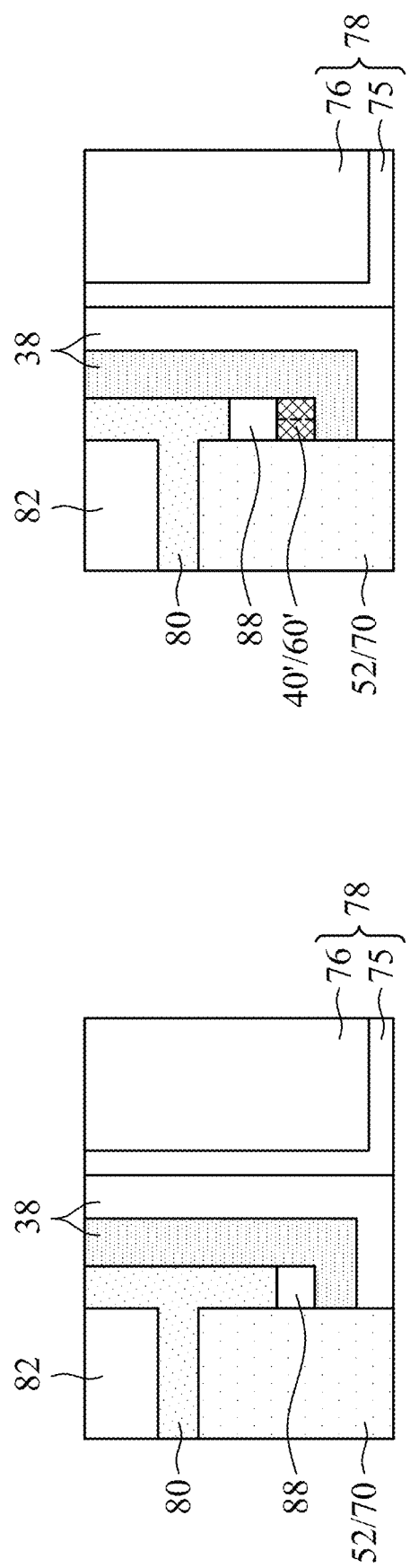
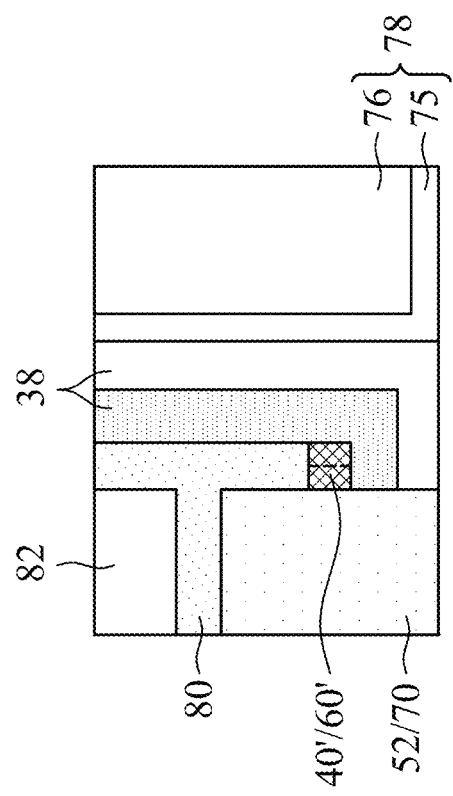
FIG. 17B
FIG. 17C
FIG. 17D

US 12,328,929 B2

METHOD OF FORMING THIN DUMMY SIDEWALL SPACERS FOR TRANSISTORS WITH REDUCED PITCHES

PRIORITY CLAIM AND CROSS-REFERENCE

This application claims the benefit of the following provisionally filed U.S. patent application Ser. No. 63/298,705, filed on Jan. 12, 2022, and entitled "Semiconductor device with Dummy sidewall spacer for EPI Hard mask and Method for Forming the Same," which application is hereby incorporated herein by reference.

BACKGROUND

In the formation of nano-structure transistors, epitaxy regions are formed as the source/drain regions. Since n-type nano-structure transistors and p-type nano-structure transistors are often formed of different materials, their source/drain regions are formed in separate epitaxy processes. Accordingly, when the source/drain regions of the n-type nano-structure transistors are formed, the source/drain regions of the p-type nano-structure transistors are masked by a mask, and vice versa.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 17A, 17B, 17C, and 17D illustrate the magnified views of some regions of transistors in accordance with some embodiments.

DETAILED DESCRIPTION

Figure 1:
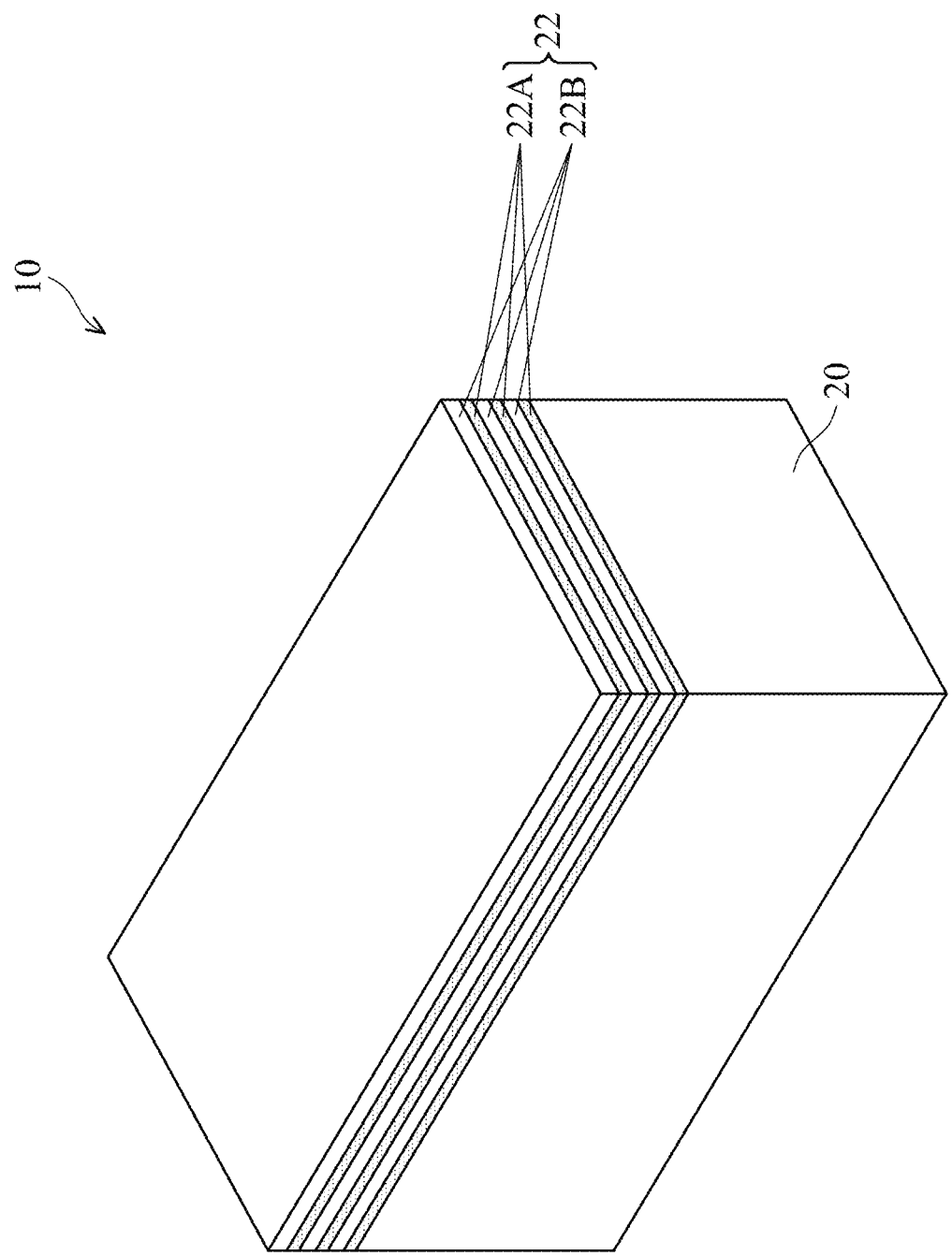
FIGS. 1-16 illustrate the cross-sectional views of intermediate stages in the formation of Gate All-Around (GAA) transistors in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Gate All-Around (GAA) transistors are formed, and the processes for selectively forming epitaxy regions for the GAA transistors are provided. In accordance with some embodiments, a metal-containing hard mask, which is thin, is formed to cover a first device region when an epitaxy semiconductor region is formed in a second device region. The metal-containing hard mask is also used to form dummy sidewall spacers in the second device region. The metal-containing hard mask has improved growth selectivity even if it is thin. Accordingly, the thickness of the metal-containing hard mask and the thickness of the dummy sidewall spacers can be reduced, and the pitches of the transistors can be reduced. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-16 illustrate the cross-sectional views of intermediate stages in the formation of GAA transistors in accordance with some embodiments of the present disclosure. The corresponding processes are also reflected schematically in the process flow shown in FIG. 31.

Referring to FIG. 1, a perspective view of wafer 10 is shown. Wafer 10 includes a multilayer structure comprising multilayer stack 22 on substrate 20. In accordance with some embodiments, substrate 20 is a semiconductor substrate, which may be a silicon substrate, a silicon germanium (SiGe) substrate, or the like, while other substrates and/or structures, such as semiconductor-on-insulator (SOI), strained SOI, silicon germanium on insulator, or the like, could be used. Substrate 20 may be doped as a p-type semiconductor, although in other embodiments, it may be doped as an n-type semiconductor.

Figure 31:
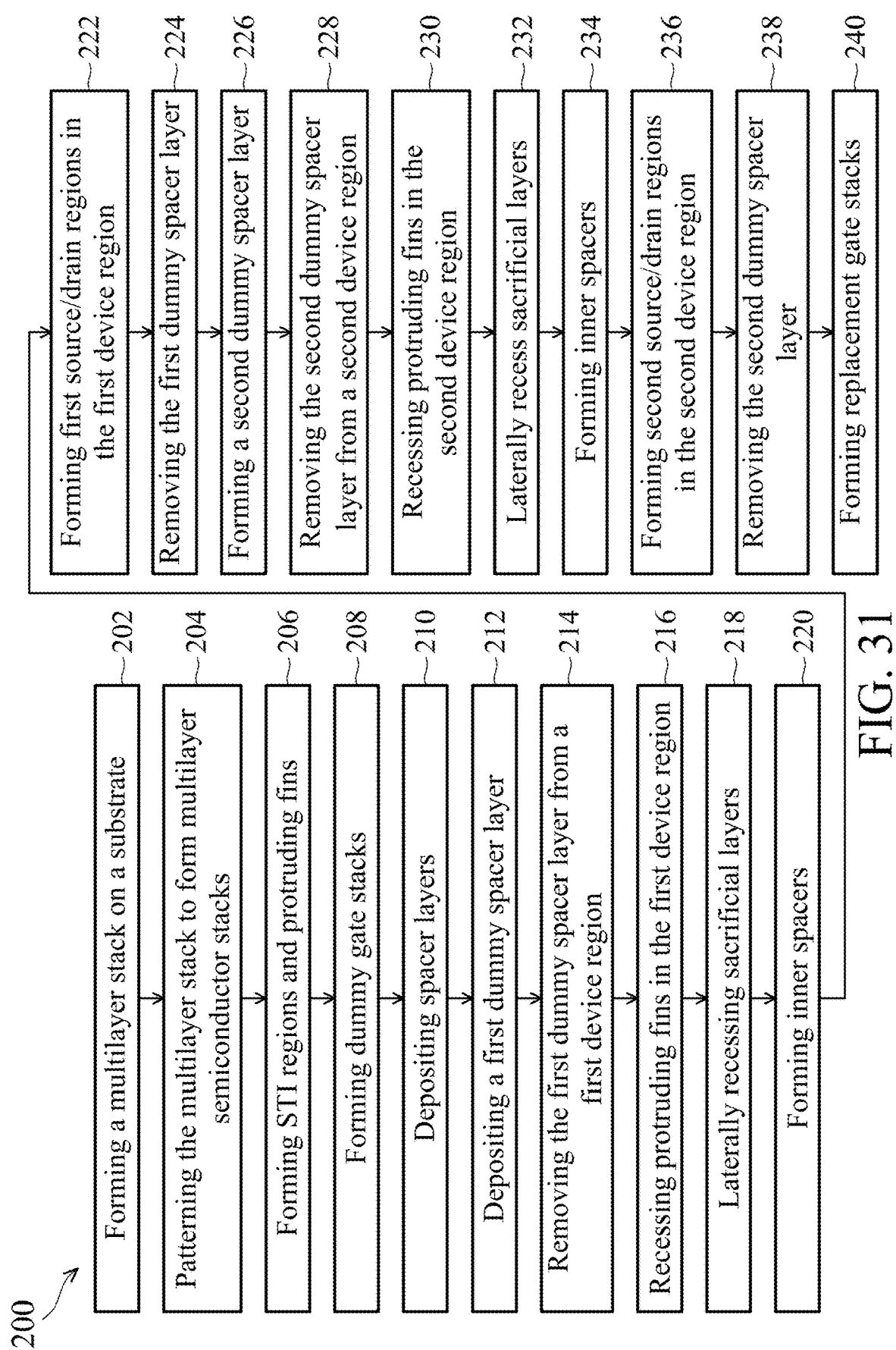
FIG. 31 illustrates a process flow for forming GAA transistors in accordance with some embodiments.

In accordance with some embodiments, multilayer stack 22 is formed through a series of deposition processes for depositing alternating materials. The respective process is illustrated as process 202 in the process flow 200 as shown in FIG. 31. In accordance with some embodiments, multilayer stack 22 comprises first layers 22A formed of a first semiconductor material and second layers 22B formed of a second semiconductor material different from the first semiconductor material.

In accordance with some embodiments, the first semiconductor material of a first layer 22A is or comprises SiGe, Ge, Si, GaAs, InSb, GaSb, InAlAs, InGaAs, GaSbP, GaAsSb, or the like. In accordance with some embodiments, the deposition of first layers 22A (for example, SiGe) is through epitaxial growth, and the corresponding deposition method may be Vapor-Phase Epitaxy (VPE), Molecular Beam Epitaxy (MBE), Chemical Vapor deposition (CVD), Low Pressure CVD (LPCVD), Atomic Layer Deposition (ALD), Ultra High Vacuum CVD (UHVCVD), Reduced Pressure CVD (RPCVD), or the like. In accordance with some embodiments, the first layer 22A is formed to a first thickness in the range between about 30 Å and about 300 Å. However, any suitable thickness may be utilized while remaining within the scope of the embodiments.

Once the first layer 22A has been deposited over substrate 20, a second layer 22B is deposited over the first layer 22A. In accordance with some embodiments, the second layers 22B is formed of or comprises a second semiconductor material such as Si, SiGe, Ge, GaAs, InSb, GaSb, InAlAs, InGaAs, GaSbP, GaAsSb, combinations of these, or the like, with the second semiconductor material being different from the first semiconductor material of first layer 22A. For example, in accordance with some embodiments in which the first layer 22A is silicon germanium, the second layer 22B may be formed of silicon, or vice versa. It is appreciated that any suitable combination of materials may be utilized for first layers 22A and the second layers 22B.

In accordance with some embodiments, the second layer 22B is epitaxially grown on the first layer 22A using a deposition technique similar to that is used to form the first layer 22A. In accordance with some embodiments, the second layer 22B is formed to a similar thickness to that of the first layer 22A. The second layer 22B may also be formed to a thickness that is different from the first layer 22A. In accordance with some embodiments, the second layer 22B may be formed to a second thickness in the range between about 10 Å and about 500 Å, for example.

Once the second layer 22B has been formed over the first layer 22A, the deposition process is repeated to form the remaining layers in multilayer stack 22, until a desired topmost layer of multilayer stack 22 has been formed. In accordance with some embodiments, first layers 22A have thicknesses the same as or similar to each other, and second layers 22B have thicknesses the same as or similar to each other. First layers 22A may also have the same thicknesses as, or different thicknesses from, that of second layers 22B. In accordance with some embodiments, first layers 22A are removed in the subsequent processes, and are alternatively referred to as sacrificial layers 22A throughout the description. In accordance with alternative embodiments, second layers 22B are sacrificial, and are removed in the subsequent processes.

In accordance with some embodiments, there are some pad oxide layer(s) and hard mask layer(s) (not shown) formed over multilayer stack 22. These layers are patterned, and are used for the subsequent patterning of multilayer stack 22.

Figure 2:
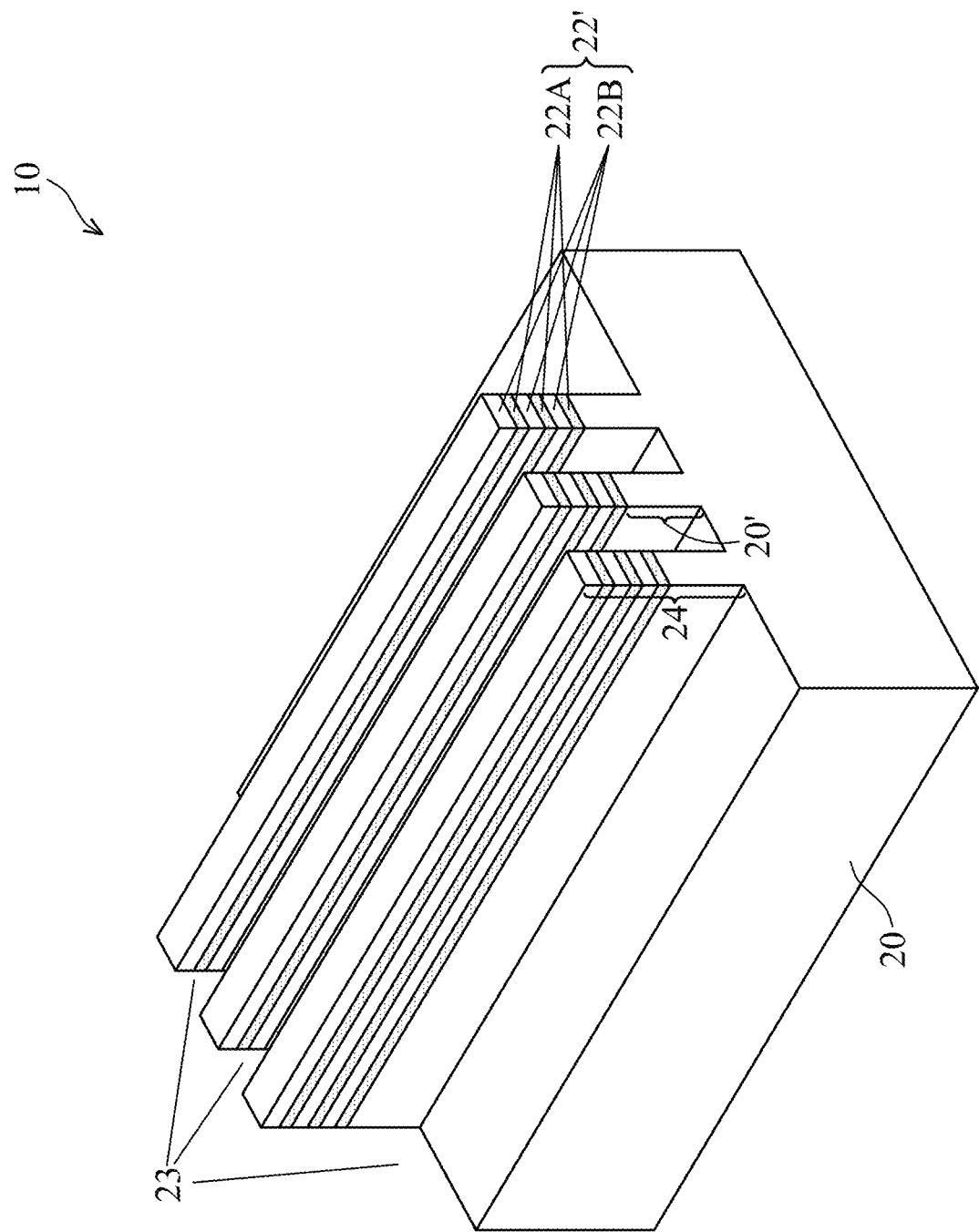

Referring to FIG. 2, multilayer stack 22 and a portion of the underlying substrate 20 are patterned in an etching process(es), so that trenches 23 are formed. The respective process is illustrated as process 204 in the process flow 200 as shown in FIG. 31. Trenches 23 extend into substrate 20. The remaining portions of multilayer stacks are referred to as multilayer stacks 22' hereinafter. Underlying multilayer stacks 22', some portions of substrate 20 are left, and are referred to as substrate strips 20' hereinafter. Multilayer stacks 22' include semiconductor layers 22A and 22B. Semiconductor layers 22A are alternatively referred to as sacrificial layers, and Semiconductor layers 22B are alternatively referred to as nanostructures hereinafter. The portions of multilayer stacks 22' and the underlying substrate strips 20' are collectively referred to as semiconductor strips 24.

In above-illustrated embodiments, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 3:
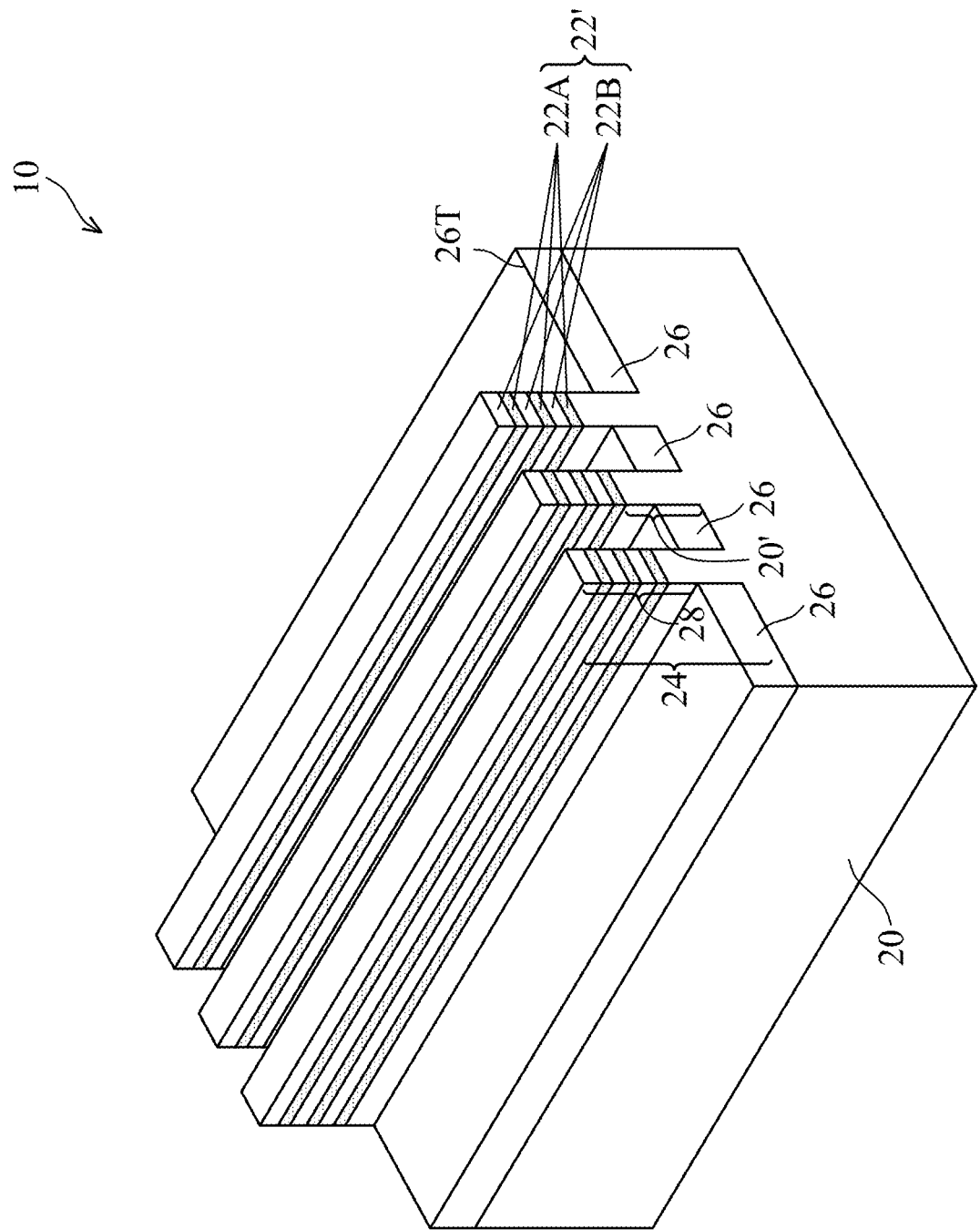

FIG. 3 illustrates the formation of isolation regions 26, which are also referred to as Shallow Trench Isolation (STI) regions throughout the description. The respective process is illustrated as process 206 in the process flow 200 as shown in FIG. 31. STI regions 26 may include a liner oxide (not shown), which may be a thermal oxide formed through the thermal oxidation of a surface layer of substrate 20. The liner oxide may also be a deposited silicon oxide layer formed using, for example, ALD, High-Density Plasma Chemical Vapor Deposition (HDPCVD), CVD, or the like. STI regions 26 may also include a dielectric material over the liner oxide, wherein the dielectric material may be formed using Flowable Chemical Vapor Deposition (FCVD), spin-on coating, HDPCVD, or the like. A planarization process such as a Chemical Mechanical Polish (CMP) process or a mechanical grinding process may then be performed to level the top surface of the dielectric material, and the remaining portions of the dielectric material are STI regions 26.

STI regions 26 are then recessed, so that the top portions of semiconductor strips 24 protrude higher than the top surfaces 26T of the remaining portions of STI regions 26 to form protruding fins 28. Protruding fins 28 include multilayer stacks 22' and the top portions of substrate strips 20'. The recessing of STI regions 26 may be performed through a dry etching process, wherein $NF_3$ and $NH_3$, for example, are used as the etching gases. During the etching process, plasma may be generated. Argon may also be included. In accordance with alternative embodiments of the present disclosure, the recessing of STI regions 26 is performed through a wet etching process. The etching chemical may include HF, for example.

Figure 4:
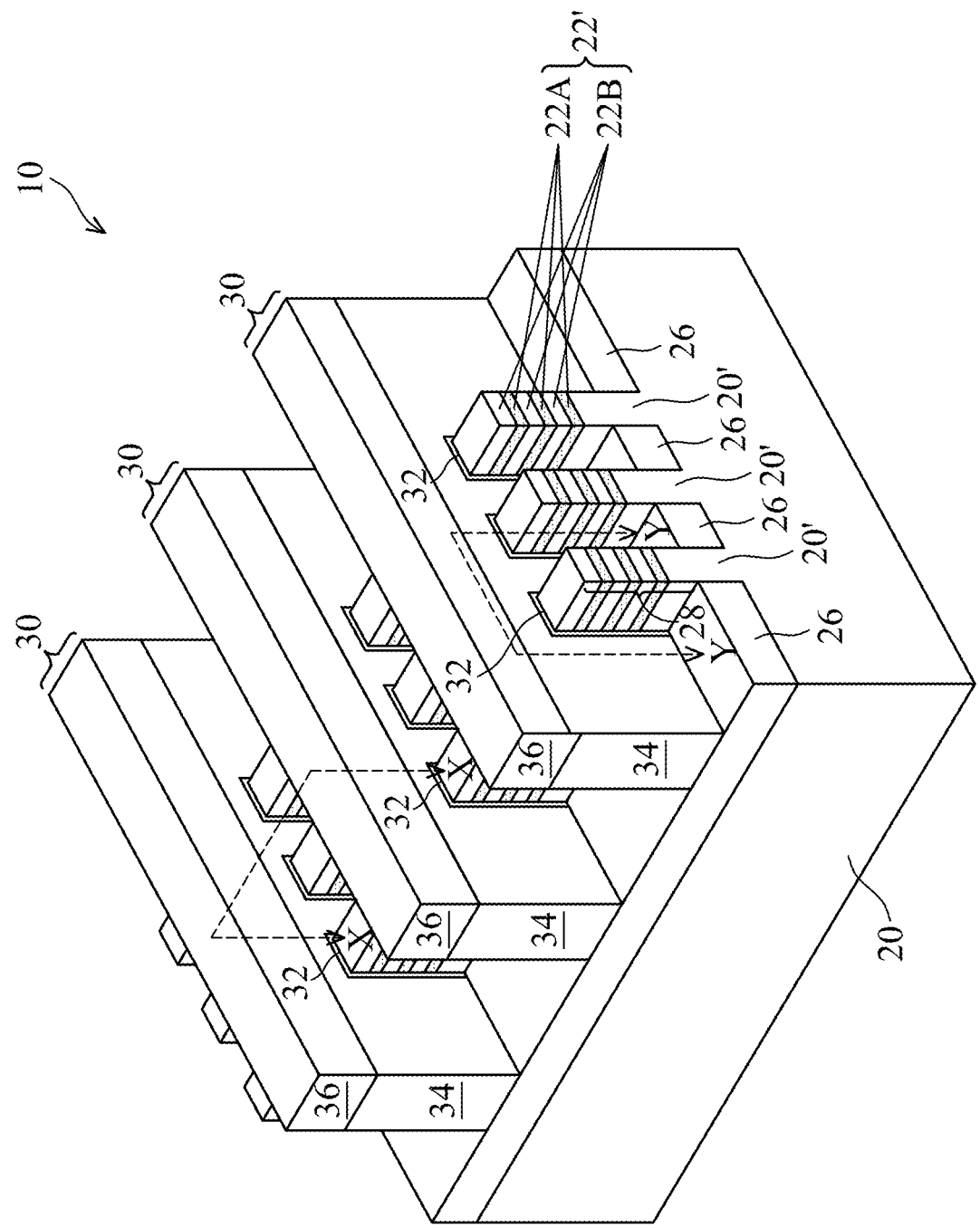

Referring to FIG. 4, dummy gate stacks 30 are formed on the top surfaces and the sidewalls of (protruding) fins 28. The respective process is illustrated as process 208 in the process flow 200 as shown in FIG. 31. Dummy gate stacks 30 may include dummy gate dielectrics 32 and dummy gate electrodes 34 over dummy gate dielectrics 32. Dummy gate dielectrics 32 may be formed by oxidizing the surface portions of protruding fins 28 to form oxide layers, or by depositing a dielectric layer such as a silicon oxide layer. Dummy gate electrodes 34 may be formed, for example, using polysilicon or amorphous silicon, and other materials such as amorphous carbon may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, silicon oxy-carbo nitride, or multilayers thereof. Dummy gate stacks 30 also have lengthwise directions perpendicular to the lengthwise directions of protruding fins 28. The formation of dummy gate stacks 30 may include forming a dummy gate dielectric layer, depositing a dummy gate electrode layer over the dummy gate dielectric layer, depositing one or more hard mask layers, and then patterning the formed layers through a patterning process(es).

Figure 5:
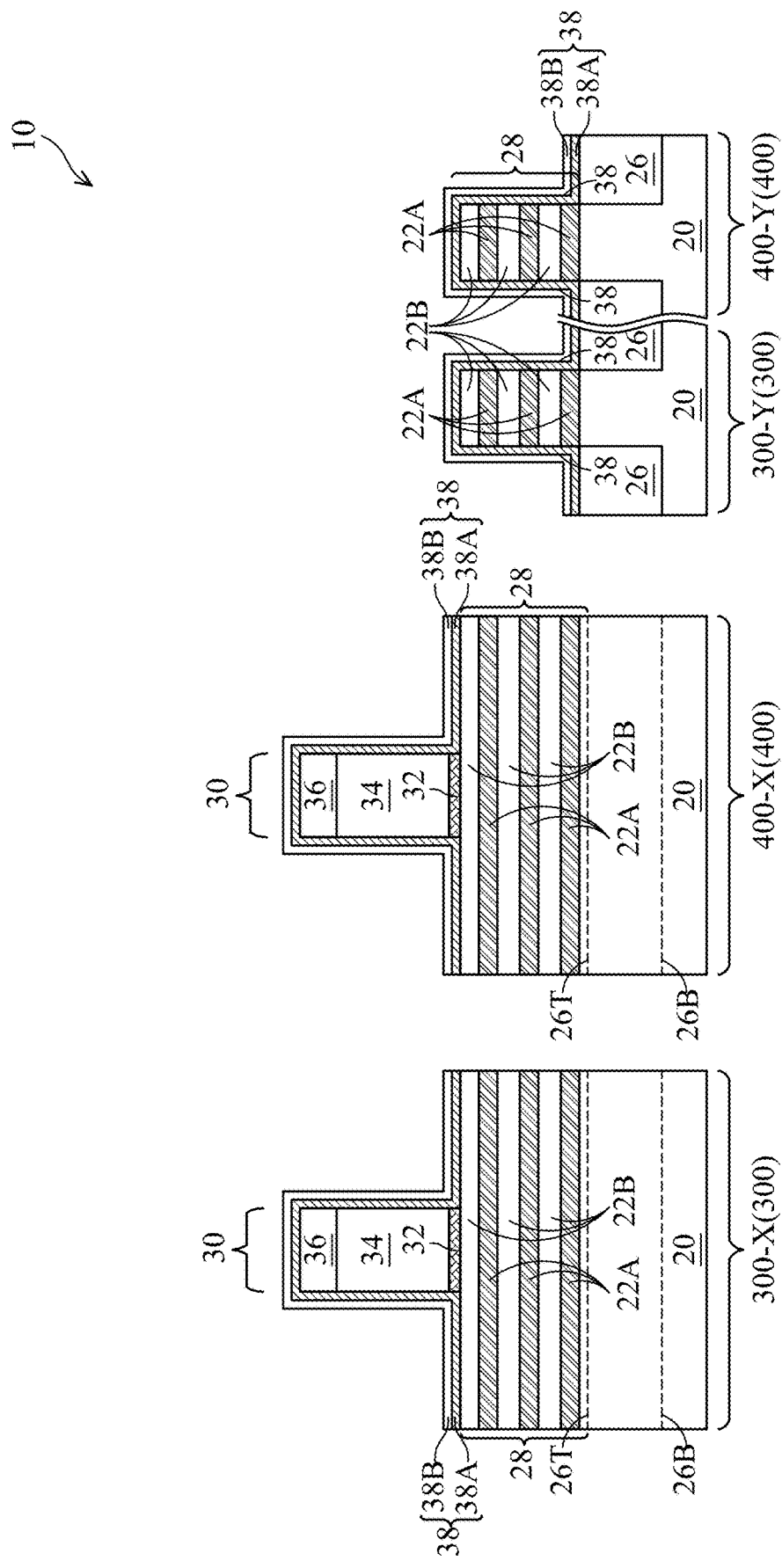

FIG. 5 illustrates the cross-sectional views of the intermediate stages in the formation of two transistors in accordance with some embodiments. The two transistors are in device regions 300 and 400. In each of the device regions 300 and 400, two cross-sectional views are presented, with the cross-sectional views obtained from the reference cross-sections X-X and Y-Y in FIG. 4. Accordingly, the illustrated cross-sectionals 300-X and 300-Y in FIG. 5 are the cross-sectional views obtained from reference cross-sections X-X and Y-Y in device region 300, while the cross-sections 400-X and 400-Y in FIG. 5 are the cross-sectional views obtained from reference cross-sections X-X and Y-Y in device region 400. The top surfaces 26T and the bottom surfaces 26B of STI regions 26 are also marked in cross-sections 300-X and 400-X. STI regions 26 are not in the cross-sections 300-X and 400-X, while the levels of top surfaces 26T and bottom surfaces 26B are marked to indicate the level of STI regions 26.

In accordance with some embodiments, the transistor 302 (FIG. 16) formed in device region 300 and the transistor 402 formed in device region 400 are of opposite conductivity types. For example, transistor 302 may be a p-type transistor, while transistor 402 is an n-type transistor, or vice versa. In accordance with alternative embodiments, transistors 302 and 402 are of the same conductivity type (n-type or p-type), but belong to different circuits such as core circuits, memory circuits, IO circuits or the like. Their source/drain regions are thus formed through separate processes to achieve different performance requirement.

Further referring to FIG. 5, spacer layers 38A and 38B, which are collectively referred to as spacer layers 38, are deposited. The respective process is illustrated as process 210 in the process flow 200 as shown in FIG. 31. In accordance with some embodiments of the present disclosure, spacer layers 38 are formed of dielectric materials selected from silicon nitride (SiN), silicon oxide ($SiO_2$), silicon carbo-nitride (SiCN), silicon oxynitride (SiON), silicon oxy-carbo-nitride (SiOCN), and the like. Spacer layers 38 may have a multi-layer structure, as illustrated, and may include two, three, or more sub layers that comprise different materials. Alternatively, spacers layer 38 may be a single layer. The formation process may include a conformal deposition process(es), so that spacer layers 38A and 38B are conformal, for example, with different parts of each of the spacer layers 38A and 38B having a thickness variation smaller than about 20 percent, or smaller than about 10 percent. The formation process may include ALD, CVD, or the like. The total thickness of spacer layers 38 may be in the range between about 4 nm and about 8 nm.

Figure 6:
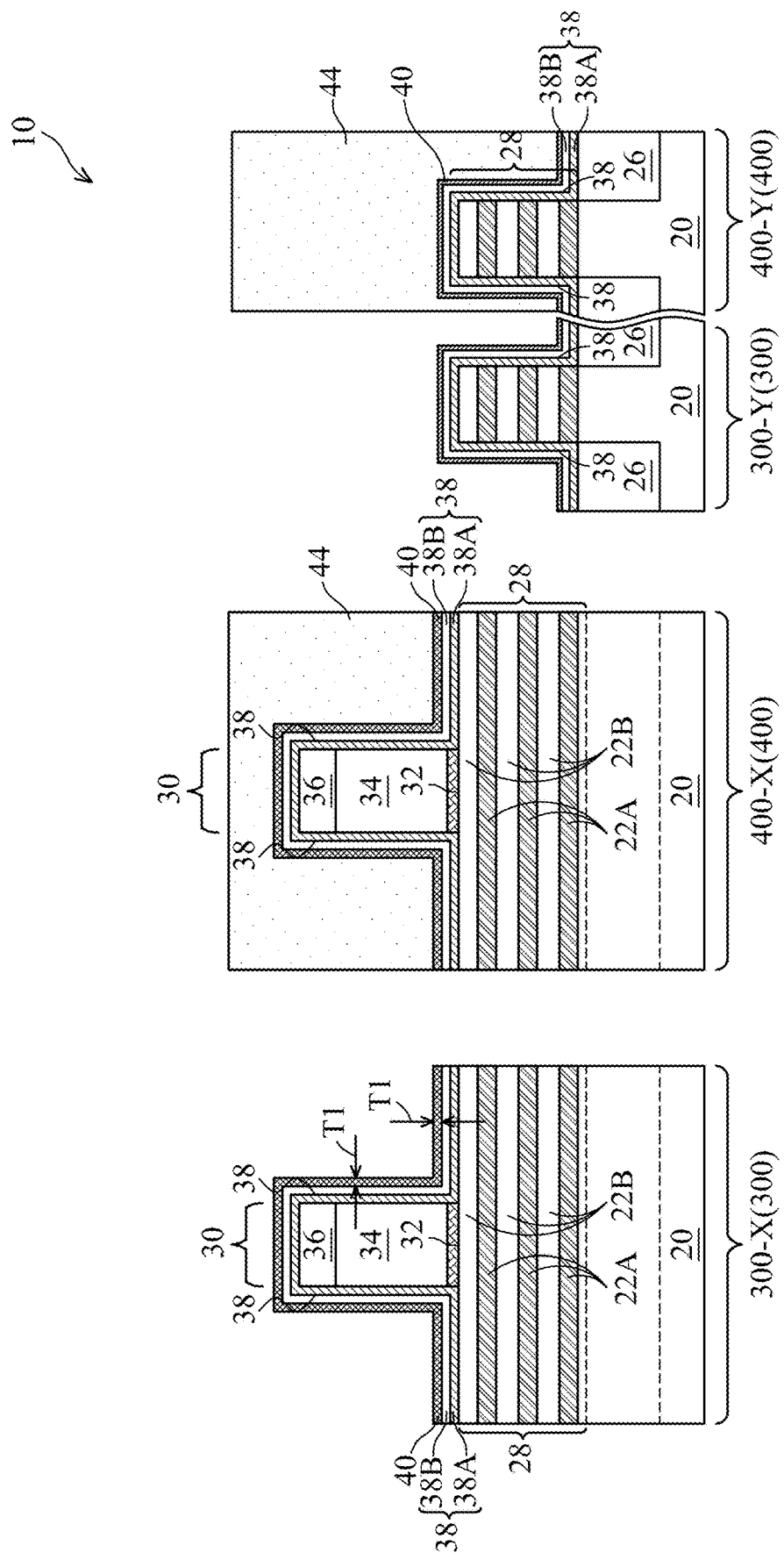
Figure 18:
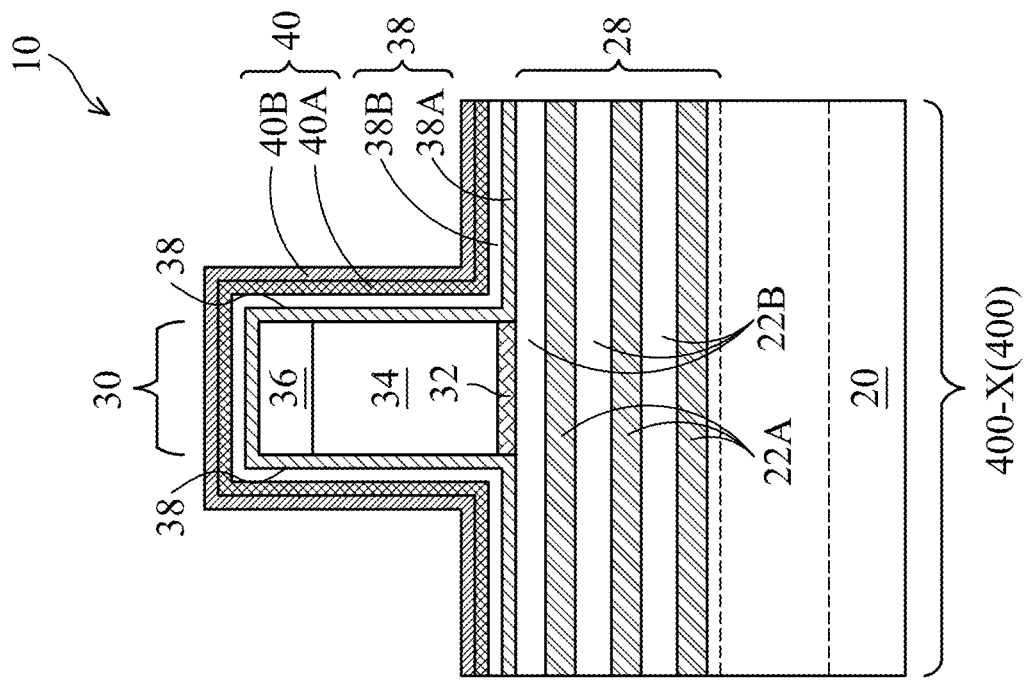
FIGS. 18-20 illustrate the cross-sectional views of intermediate stages in the formation of GAA transistors in accordance with alternative embodiments.
Figure 18:
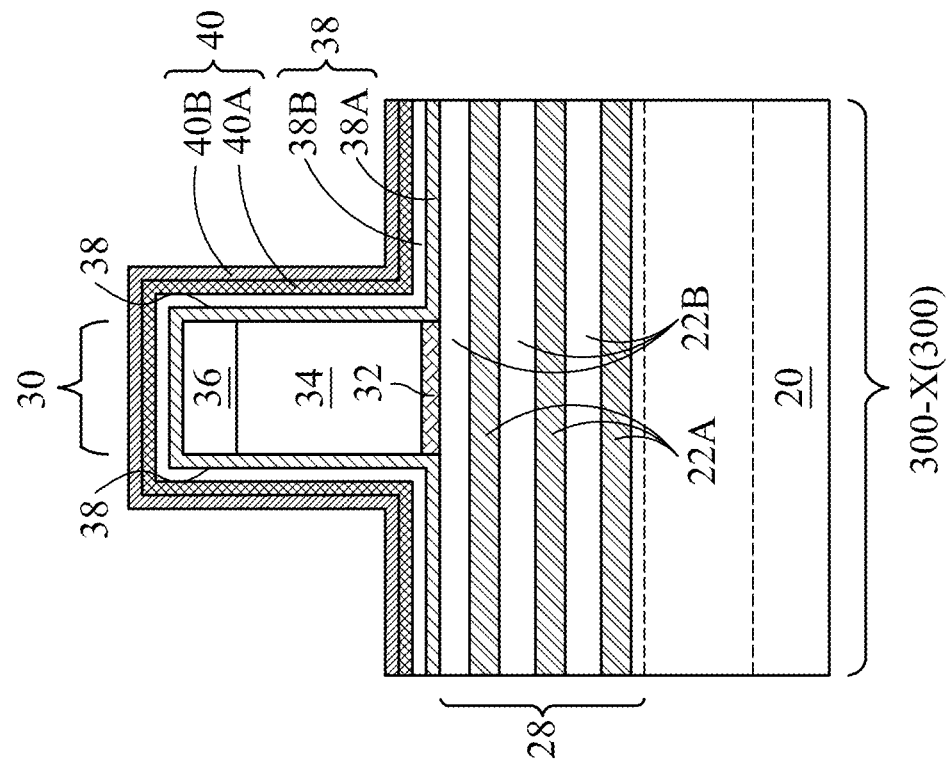

Referring to FIG. 6, dummy spacer layer 40 is deposited. The respective process is illustrated as process 212 in the process flow 200 as shown in FIG. 31. Dummy spacer layer 40 is such named since it is also used to form dummy spacers in subsequent processes, which dummy spacers are later removed. In accordance with some embodiments, dummy spacer layer 40 is formed of or comprises a metal-containing material, which may be a dielectric material. The metal-containing dielectric material may be formed of or comprise a metal oxide, and hence dummy spacer layer 40 is alternatively referred to metal oxide layer 40 hereinafter, while it may also be a metal-containing dielectric layer free from oxygen, and may be metal nitride. In accordance with some embodiments, dummy spacer layer 40 is formed of or comprises aluminum oxide, titanium oxide, zirconium oxide, hafnium zirconium oxide, or the like, or combinations thereof. Alternatively, dummy spacer layer 40 may be a metal nitride, metal carbide, or the like, which metal is as aforementioned. In accordance with some embodiments, dummy spacer layer 40 is a single layer formed of a homogeneous material, which may be selected from the aforementioned list. In accordance with alternative embodiments, dummy spacer layer 40 is a composite layer including two or more composite layers. For example, FIG. 18 illustrates a dummy spacer layer 40 formed of multiple layers.

The thickness T1 of dummy spacer layer 40 is controlled to be smaller, for example, smaller than about 4 nm, and may be in the range between about 2 nm and about 4 nm. Depending on the material of dummy spacer layer 40, the thickness T1 of dummy spacer layer 40 may be further reduced, for example, to the range between about 1 nm and about 2 nm. Dummy spacer layer may 40 may have a dielectric constant (k value) higher than about 7.0.

FIG. 6 further illustrates the formation of etching mask 44, which is then patterned. The patterned etching mask 44 covers device region 400, and leaves device region 300 open. Etching mask 44 may have a single layer structure including a photoresist, a dual-layer structure including a photoresist and a bottom reflective coating under the photoresist, or may be a tri-layer, a quadra-layer, or the like.

Figure 7:
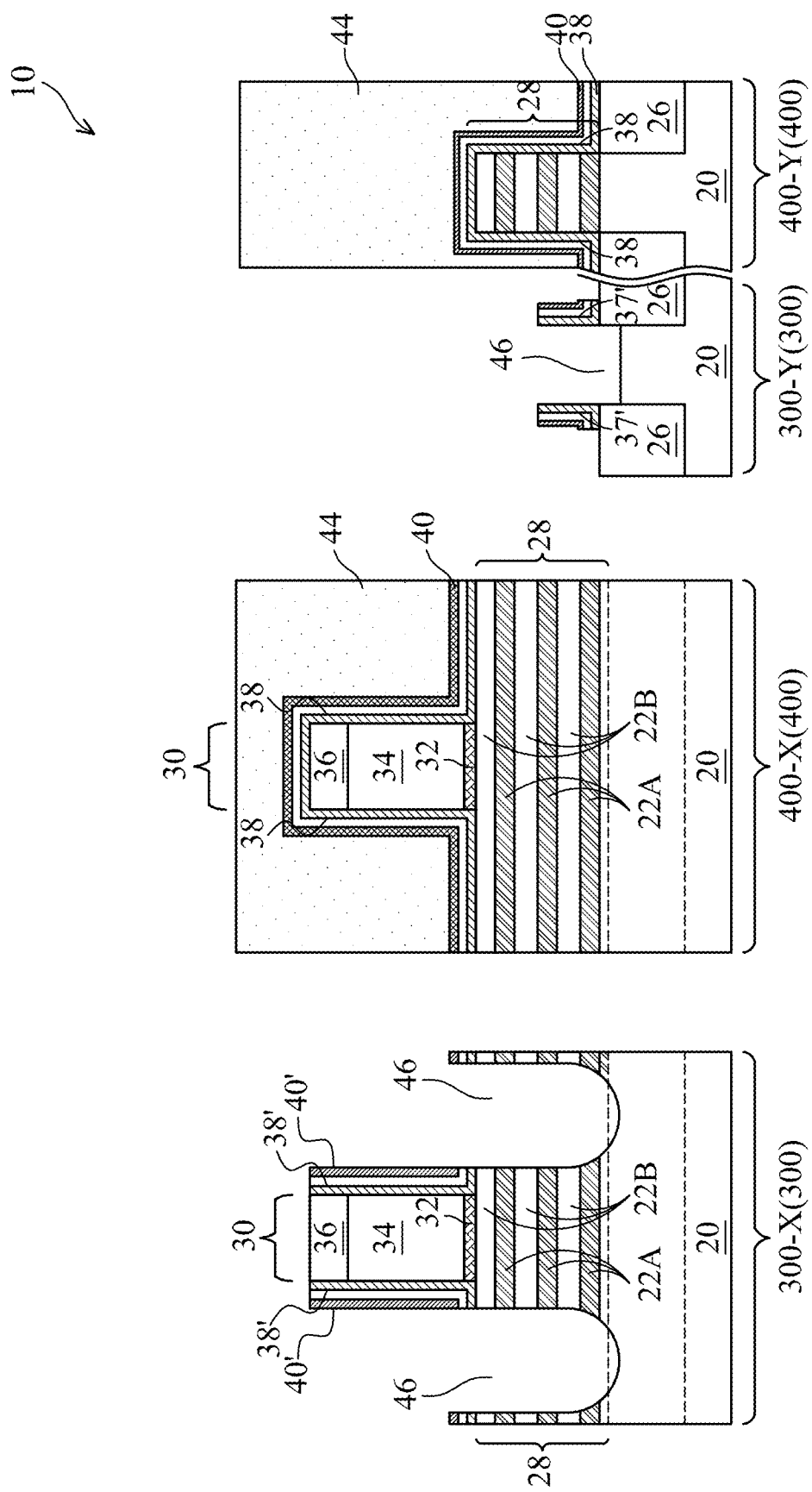

Referring to FIG. 7, an anisotropic etching process(es) is performed. The horizontal portions of dummy spacer layer 40 and spacer layers 38 in device region 300 are removed, exposing the underlying portions of protruding fins 28. The respective process is illustrated as process 214 in the process flow 200 as shown in FIG. 31. The vertical portions of spacer layers 38 and dummy spacer layer 40 are left as gate spacers 38' and dummy sidewall spacers 40', respectively. The remaining portions of spacer layers 38 in cross-section 300-Y also form fin spacers 37'. The etching may include a plurality of etching processes using different etching gases. For example, a first etching process may be performed to etch dummy spacer layer 40, followed by a second etching process(es) to etch spacer layers 38. The first etching process may be performed using etching gases such as $BCl_3$, $Cl_2$, $CF_4$, $CH_4$, $CHF_3$, etc., and Ar and/or $O_2$ may be added. The second etching process may be performed using etching gases such as the mixture of $NF_3$ and $NH_3$, the mixture of HF and $NH_3$, and/or a fluorine-containing gas such as $CF_4$, $NF_3$, $SF_6$, $CHF_3$, or combinations thereof.

Next, the portions of protruding fins 28 that are not directly underlying dummy gate stacks 30, gate spacers 38', and dummy sidewall spacers 40' are vertically recessed through an etching process to form recesses 46. The respective process is illustrated as process 216 in the process flow 200 as shown in FIG. 31. For example, a dry etch process may be performed using $C_2F_6$, $CF_4$, $SO_2$, the mixture of HBr, $Cl_2$, and $O_2$, the mixture of HBr, $Cl_2$, $O_2$, and $CH_2F_2$, or the like to etch multilayer semiconductor stacks 28 and the underlying substrate strips 20'. The bottoms of recesses 46 are at least level with, or may be lower than the bottoms of multilayer semiconductor stacks 28. The etching may be anisotropic, so that some sidewalls of multilayer semiconductor stacks 28 facing recesses 46 are vertical and straight.

Figure 8:
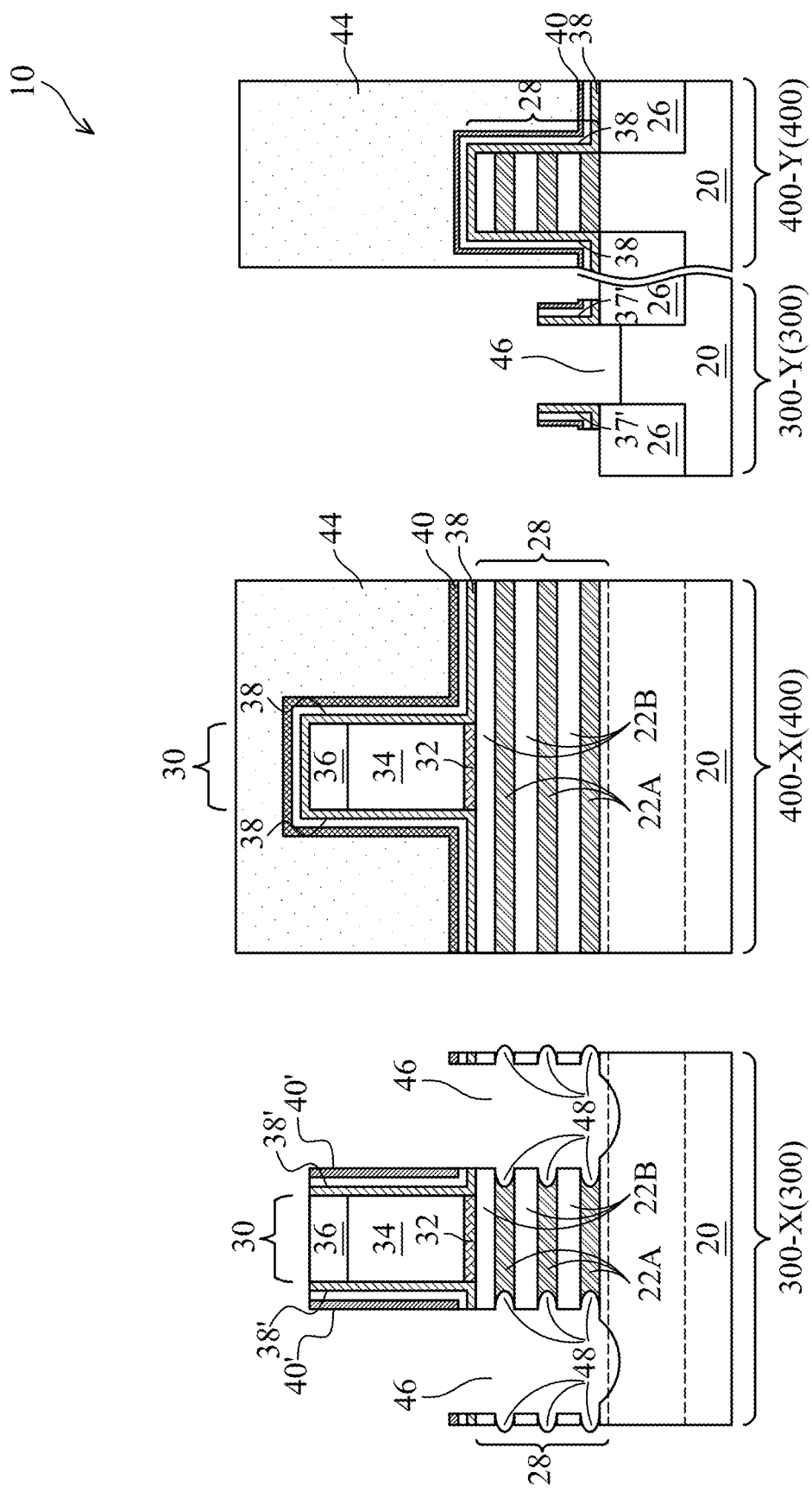

Referring to FIG. 8, sacrificial semiconductor layers 22A are laterally recessed to form lateral recesses 48, which are recessed from the edges of the respective overlying and underlying nanostructures 22B. The respective process is illustrated as process 218 in the process flow 200 as shown in FIG. 31. The lateral recessing of sacrificial semiconductor layers 22A may be achieved through a wet etching process using an etchant that is more selective to the material (for example, silicon germanium (SiGe)) of sacrificial semiconductor layers 22A than the material (for example, silicon (Si)) of the nanostructures 22B and substrate 20. For example, in an embodiment in which sacrificial semiconductor layers 22A are formed of silicon germanium and the nanostructures 22B are formed of silicon, the wet etching process may be performed using an etchant such as hydrochloric acid (HCl). In accordance with alternative embodiments, the lateral recessing of sacrificial semiconductor layers 22A is performed through an isotropic dry etching process or a combination of a dry etching process and a wet etching process. After the lateral recessing process, etching mask 44 is removed.

Figure 9:
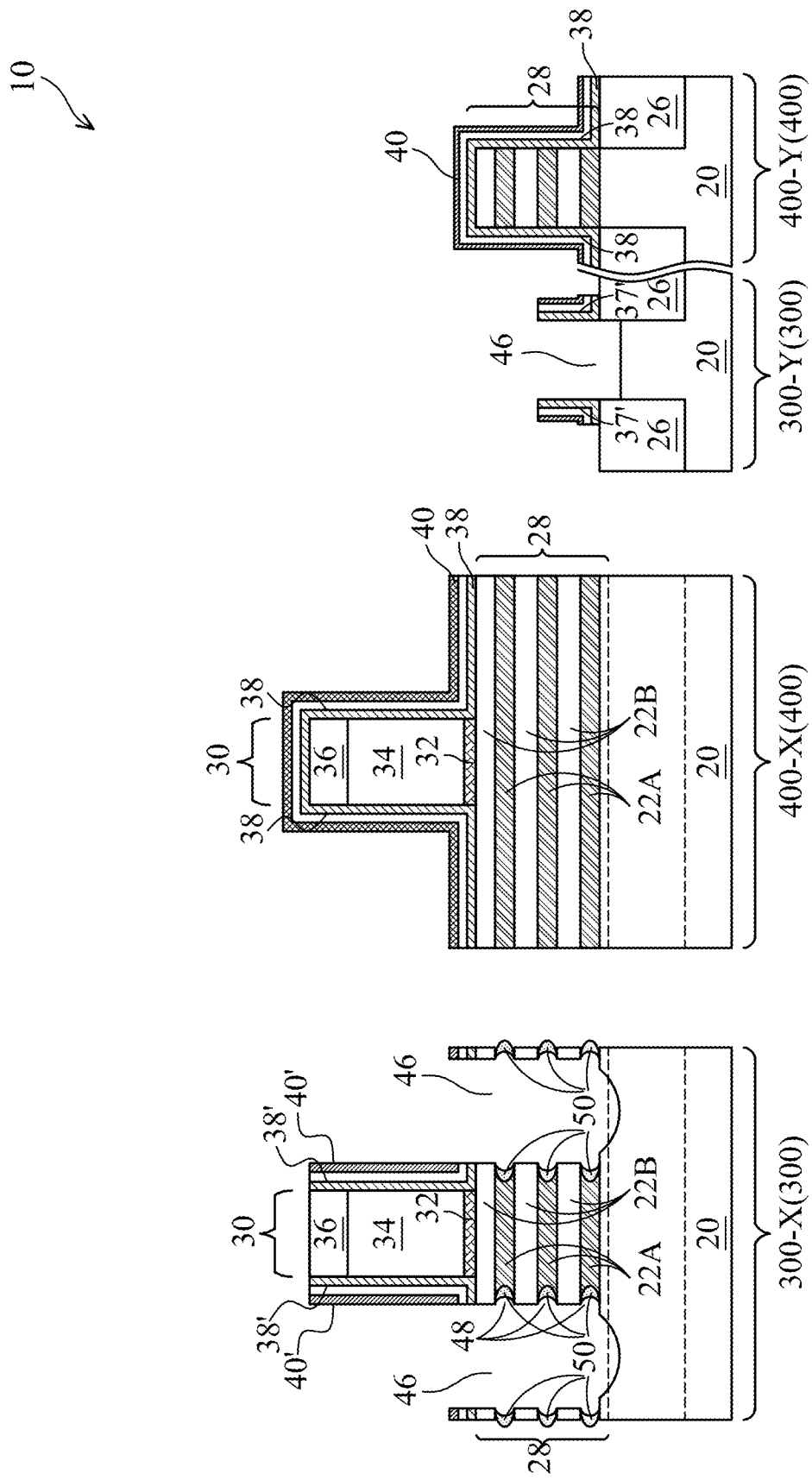

FIG. 9 illustrates the formation of inner spacers 50. The respective process is illustrated as process 220 in the process flow 200 as shown in FIG. 31. In accordance with some embodiments, the formation of inner spacers 50 includes depositing a dielectric layer, and the then etching the dielectric layer to remove the portions of dielectric layer outside of lateral recesses 48. The material of the dielectric layer may include Si, O, C, N, or combinations thereof. The dielectric layer may be deposited as a conformal layer, which may have a relatively low k value, which may range from about 3.0 to about 4.5. The thickness of the spacer layer may be in the range between about 4 nm and about 6 nm. The etching of the dielectric layer may be performed through a wet etching process, in which the etching chemical may include $H_2SO_4$, diluted HF, ammonia solution ($NH_4OH$, ammonia in water), or the like, or combinations thereof. Alternatively, a dry etching process may be performed. The sidewalls of nanostructures 22B and the outer surfaces of inner spacers 50 may be concave, and may be rounded.

A cleaning process may then be performed to prepare the structure for the subsequent epitaxy. In accordance with some embodiments, the cleaning process may be performed using $H_2SO_4$, $H_2O_2$, and the like, followed by the rinsing using deionized water.

Figure 10:
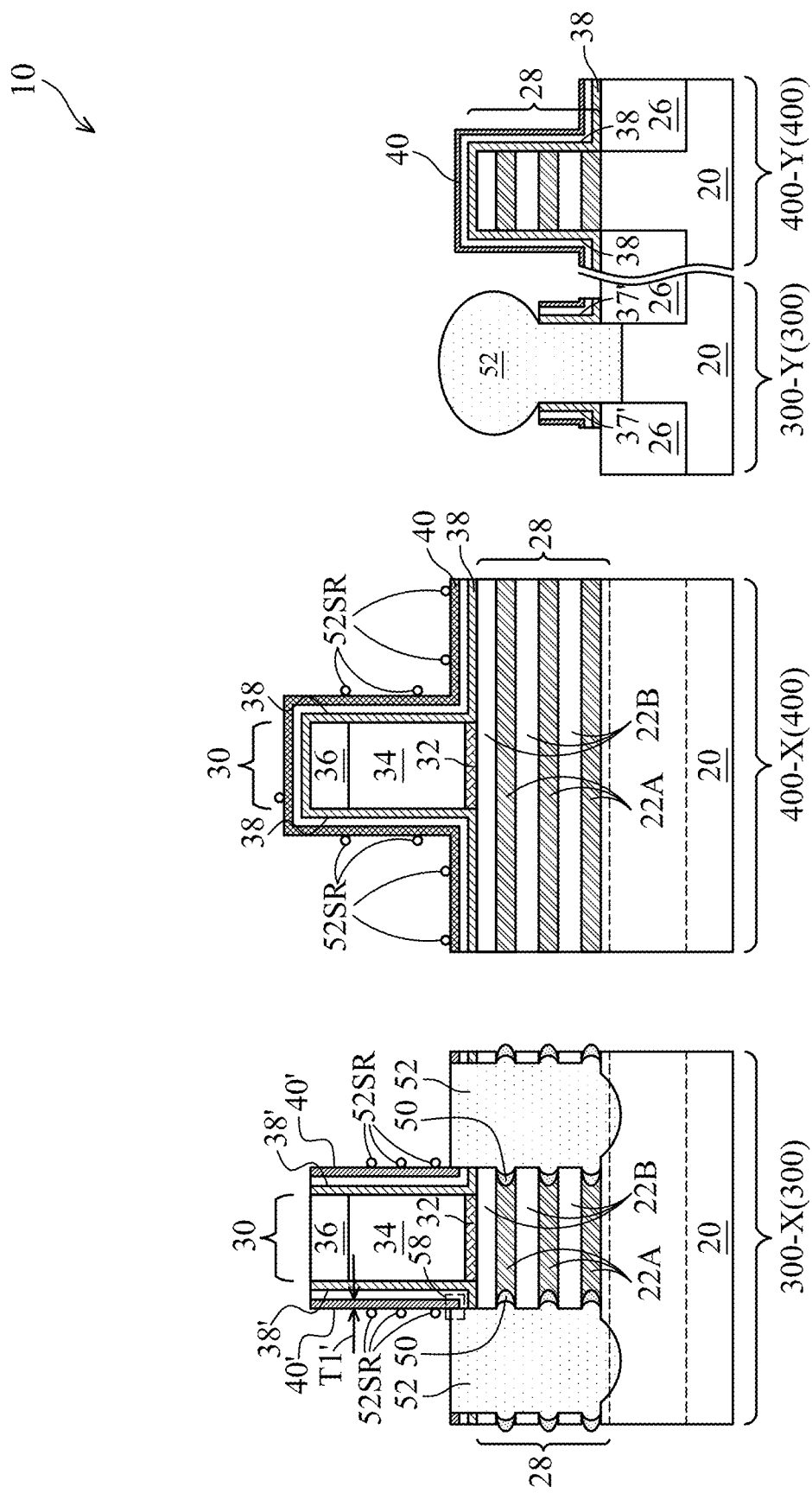

Referring to FIG. 10, epitaxial source/drain regions 52 are formed in recesses 46 and 48. The respective process is illustrated as process 222 in the process flow 200 as shown in FIG. 31. In accordance with some embodiments, source/drain regions 52 may exert stress on the nanostructures 22B, which are used as the channels of the corresponding GAA transistors, thereby improving performance. Depending on whether the resulting transistor in device region 300 is a p-type transistor or an n-type transistor, a p-type or an n-type impurity may be in-situ doped with the proceeding of the epitaxy. For example, when the resulting transistor is a p-type Transistor, silicon germanium boron (SiGeB), silicon boron (SiB), or the like may be grown. Conversely, when the resulting transistor is an n-type Transistor, silicon phosphorous (SiP), silicon carbon phosphorous (SiCP), SiAs, or the like, or combinations thereof may be grown.

The epitaxy is selective, and is intended to be grown on semiconductor, but not on dielectric. Accordingly, the growth occurs on the top surfaces of semiconductor substrate 20 and the sidewalls of nanostructures 22B. On the other hand, in device region 300, the epitaxy on the sidewalls of dummy sidewall spacers 40' and the top surfaces of hard mask 36 is minimized, if any. In addition, in device region 400, dummy spacer layer 40 is used to prevent the epitaxy from occurring. Furthermore, an etching gas such as HCl, $Cl_2$, or the like is added into the process gases to improve the selective deposition.

The growth selectivity, which is the ratio of the growth rate (the increase of thickness per unit time) on semiconductor to the growth rate on dielectric such as on dummy sidewall spacers 40' and dummy spacer layer 40, is preferably high. Since the growth selectivity is not infinitely high, there may be some small semiconductor parts 52SR grown on the dummy sidewall spacers 40' and dummy spacer layer 40, as schematically illustrated. The semiconductor parts 52SR should be as less as possible, and are minimized due to the high growth selectivity of the material of dummy spacer layer 40, as discussed in detail in subsequent paragraphs.

It has been found that the growth selectivity is related to the dielectric materials, and when some dielectric materials are used, the growth rate on these dielectric materials is lower than on other dielectric materials, even if same growth process conditions are used. For example, experimental results have indicated that metal oxides such as aluminum oxide, titanium oxide, zirconium oxide, hafnium zirconium oxide, and the like, have higher growth selectivity than non-metal-containing dielectrics such as silicon nitride. For example, the growth selectivity of aluminum oxide is described by defect level. Aluminum oxide inhibits the epitaxy growth thereon, and the defect level (the number of spots on wafer wherein epitaxy occurred on aluminum oxide) is less than 1E3 per wafer.

Furthermore, the metal oxides may have high growth selectivity even if the thicknesses of the metal oxides are small. The non-metal-containing dielectrics such as silicon nitride, however, need to have certain minimum thickness in order to achieve certain growth selectivity. This means that the same growth selectivity may be achieved on a metal oxide with a smaller thickness than on a non-metal-containing dielectric with a greater thickness.

Figure 30:
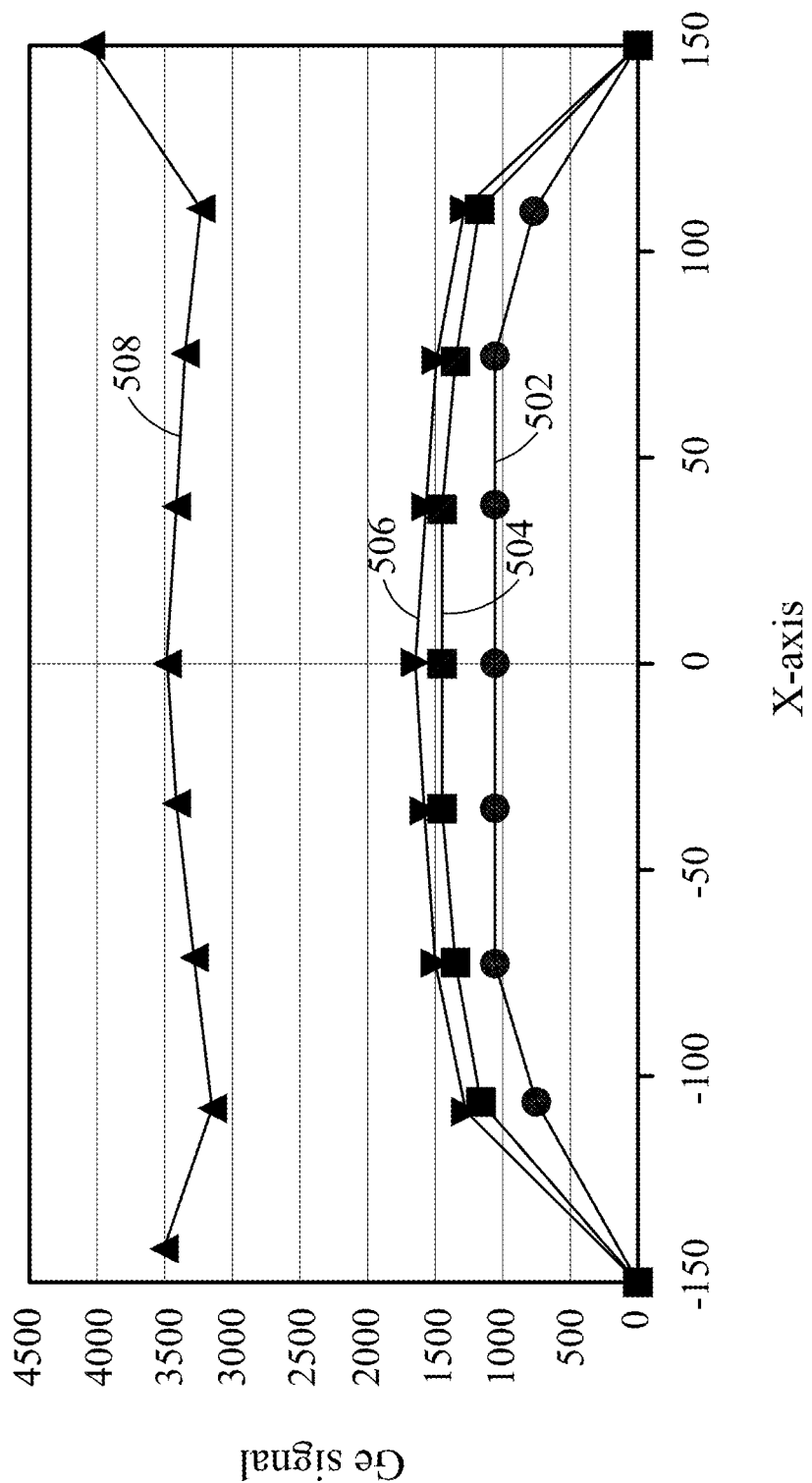
FIG. 30 illustrates the relationship between the germanium signal as a function of the thicknesses and materials of some hard masks in accordance with some embodiments.

FIG. 30 illustrates some experimental results obtained from aluminum oxide, which is a metal oxide, and from silicon nitride, which is a non-metal-containing dielectric material. The experiments are performed with the grown semiconductor including germanium, and the Y-axis represents the germanium signal strength detected from the surfaces of masks formed of aluminum oxide or silicon nitride. Higher germanium signal strength means more germanium are grown, and that the growth selectivity is lower. The X-axis represents the positions on a wafer along a diameter. Line 502 is obtained from aluminum oxide with a thickness of 20 Å, and HCl is used as the etching gas. Line 504 is obtained from aluminum oxide with a thickness of 45 Å, and no etching gas is used. Line 506 is obtained from aluminum oxide with a thickness of 20 Å, and no etching gas is used. Line 508 is obtained from silicon nitride with a thickness of 50 Å, and no etching gas is used.

The experimental results indicate that although silicon nitride mask is thicker than all aluminum oxide masks, the corresponding germanium signal strength (line 508) on the silicon nitride mask is significantly higher than the germanium signal strength on the aluminum oxide masks (lines 502, 504, and 506), with some aluminum oxide masks having less than half of the thickness than the silicon nitride mask. This indicates that aluminum oxide has the significantly better growth selectivity than silicon nitride, and the required thickness of aluminum oxide mask may be reduced by more than a half of the thickness of the mask formed of silicon nitride. Furthermore, the comparison of lines 504 and 506 indicates that the growth selectivity of aluminum oxide masks is not sensitive to the thickness of the aluminum oxide mask, at least when the thickness of the aluminum oxide mask is as small as 20 Å. The comparison of line 502 to lines 504 and 506 indicate that the etching gas may improve growth selectivity.

The low growth sensitivity of the non-metal-containing dielectrics posts a problem when the pitches of the transistors are reduced since the increased thicknesses of the dummy sidewall spacers 40' add to the pitches of the transistors. Accordingly, with the metal-containing hard masks being able to achieve high growth selectivity, thin metal-containing hard masks may be used while still maintaining high-enough growth selectivity. The pitches of the transistors may thus be reduced.

Referring back to FIG. 10, in accordance with some embodiments of the present disclosure, the thickness T1' of dummy sidewall spacers 40' is close to the thickness T1 of dummy spacer layer 40 (FIG. 6). For example, thickness T1' may be smaller than about 4 nm, and may be in the range between about 2 nm and about 4 nm, or in the range between about 1 nm and about 2 nm.

Dummy sidewall spacers 40' in device region 300 and dummy spacer layer 40 in device region 400 are then removed. The respective process is illustrated as process 224 in the process flow 200 as shown in FIG. 31. Gate spacers 38' in device region 300 and spacer layers 38 in device region 400, on the other hand, are left unremoved. In accordance with some embodiments, the removal process is performed using $BCl_3$, $Cl_2$, $CF_4$, $CH_4$, $CHF_3$, etc. Ar and/or $O_2$ may be added. After the removal process, a recess will be formed in region 58, which recess is left by a portion of the dummy sidewall spacers 40' that was previously formed between the top portions of source/drain regions 52 and the respective nearest gate spacers 38'.

FIGS. 11 through 15 illustrates the formation of source/drain regions for the transistor 402 (FIG. 16) in device region 400 in accordance with some embodiments. Some brief processes are discussed below. The details of these processes and the corresponding materials may be essentially the same as illustrated in and discussed referring to the corresponding processes as shown in FIGS. 6 and 10. The details may not be repeated, and may be found in the discussion referring to FIGS. 6 through 10.

Figure 11:
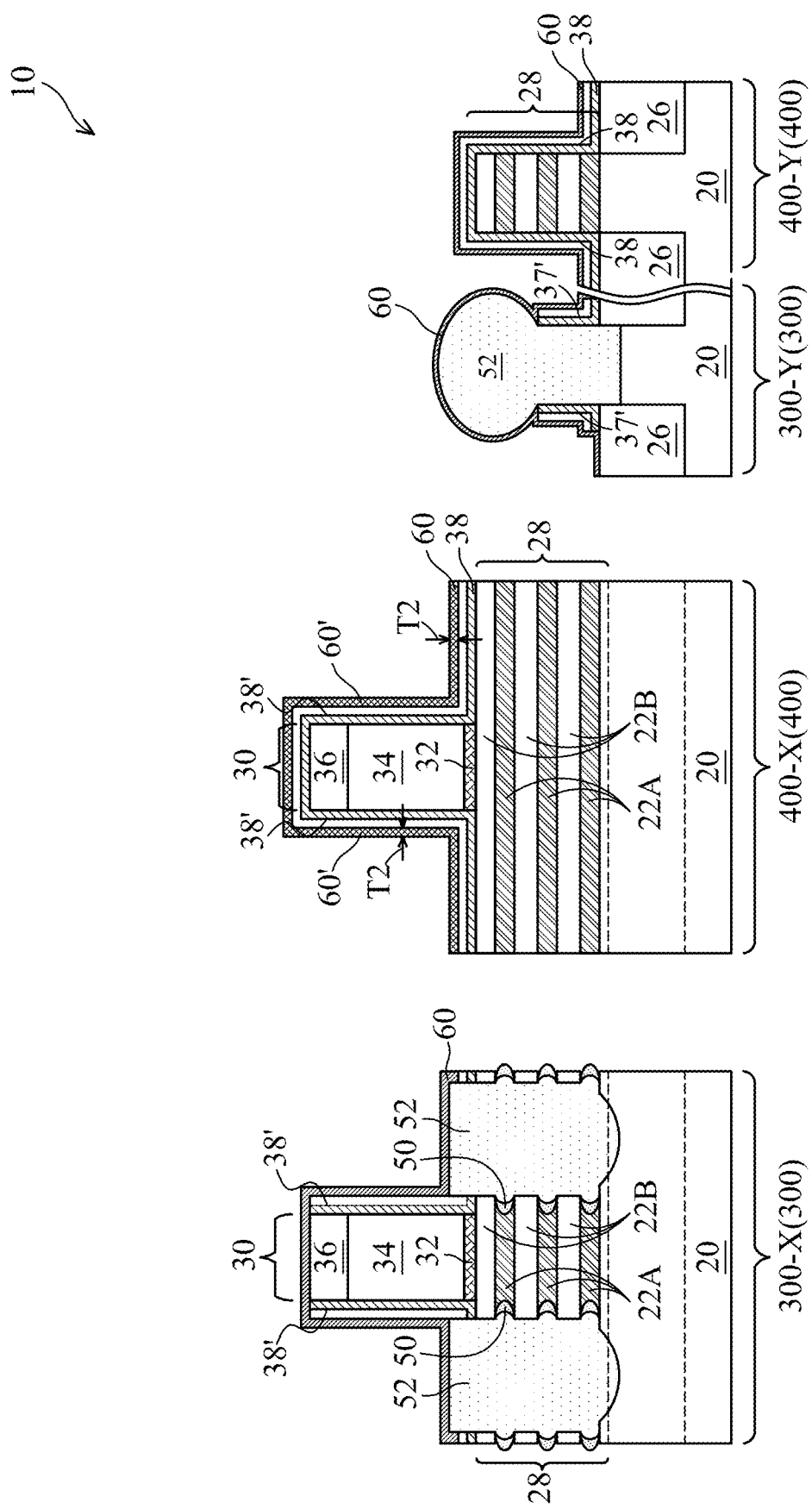

Referring to FIG. 11, dummy spacer layer 60 is deposited. The respective process is illustrated as process 226 in the process flow 200 as shown in FIG. 31. Dummy spacer layer 60 may be formed of a material selected from the same group of candidate materials for forming dummy spacer layer 40. For example, dummy spacer layer 60 may comprise aluminum oxide, titanium oxide, zirconium oxide, hafnium zirconium oxide, or the like. Dummy spacer layer 60 may be a single layer formed of a homogenous material, or may be a composite layer comprising a plurality of sub-layers formed of different materials.

The material of dummy spacer layer 60 may be the same as, or different from, the material of dummy spacer layer 40 (FIG. 6). Dummy spacer layer 60 may have a thickness T2 smaller than about 4 nm, or may be in the range between about 2 nm and about 4 nm. Thickness T2 may also be in the range between about 1 nm and about 2 nm. Dummy spacer layer 60 includes a first portion in device region 300, and the first portion covers source/drain regions 52, gate spacers 38', and dummy gate stack 30. Dummy spacer layer 60 also includes a second portion in device region 400 and the second portion covers protruding fins 28 and dummy gate stack 30.

Figure 12:
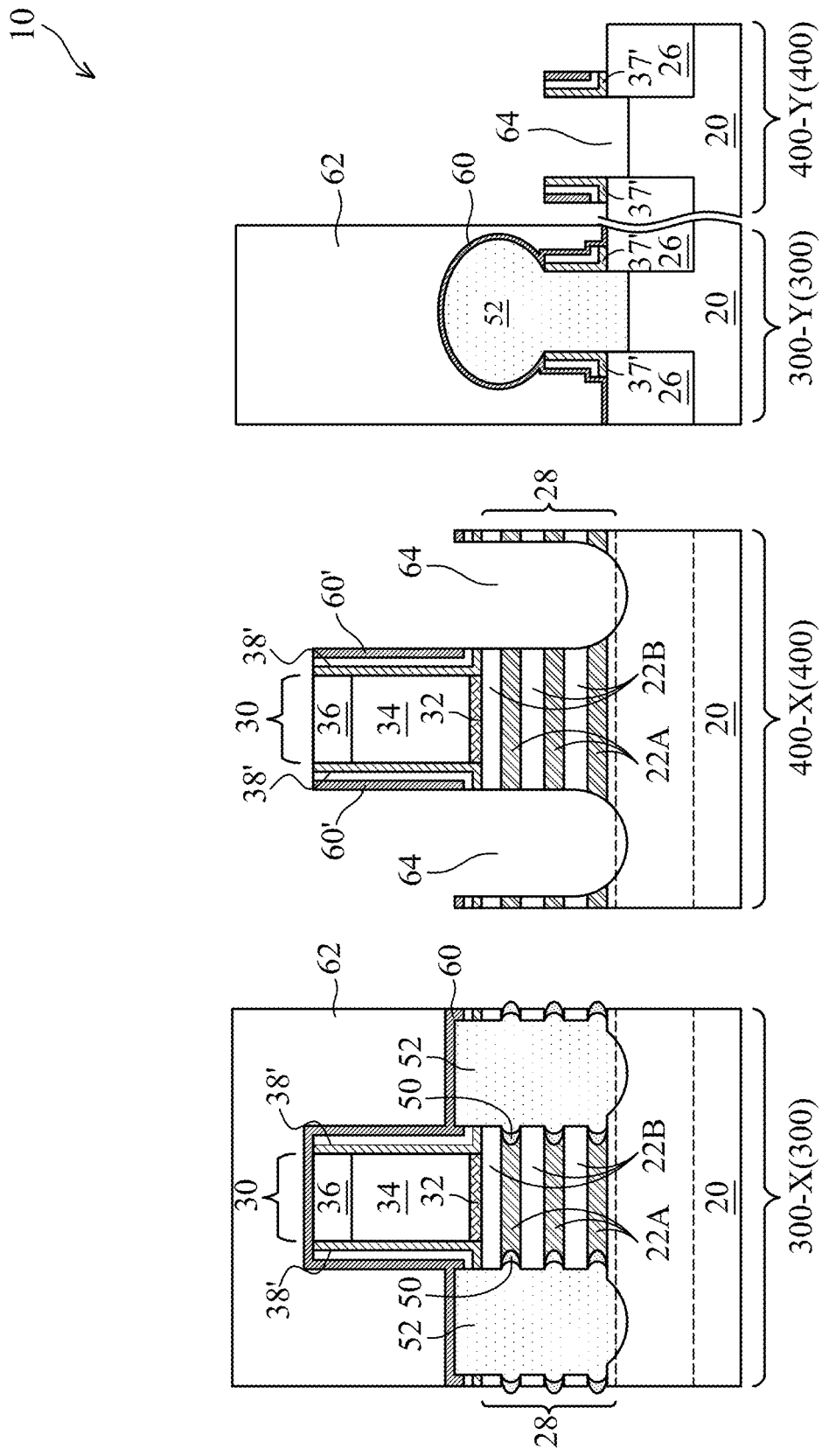

Referring to FIG. 12, etching mask 62, which corresponds to etching mask 44 in FIG. 6, is formed and patterned to cover device region 300, while leaving device region 400 opening. Next, an anisotropic etching process(es) is performed. Some horizontal portions of dummy spacer layer 60 and spacer layers 38 in device region 400 are removed, exposing the underlying portions of protruding fins 28. The respective process is illustrated as process 228 in the process flow 200 as shown in FIG. 31. The vertical portions of spacer layers 38 and dummy spacer layer 60 are left as gate spacers 38' and dummy sidewall spacers 60', respectively. The remaining portions of spacer layers 38 in cross-section 400-Y also form fin spacers 37'.

Next, in device region 400, the portions of protruding fins 28 that are not directly underlying dummy gate stacks 30, gate spacers 38', and dummy sidewall spacers 60' are vertically recessed through an etching process to form recesses 64. The respective process is illustrated as process 230 in the process flow 200 as shown in FIG. 31. The etching may be anisotropic, so that some sidewalls of multilayer semiconductor stacks 28 facing recesses 64 are vertical and straight.

Figure 13:
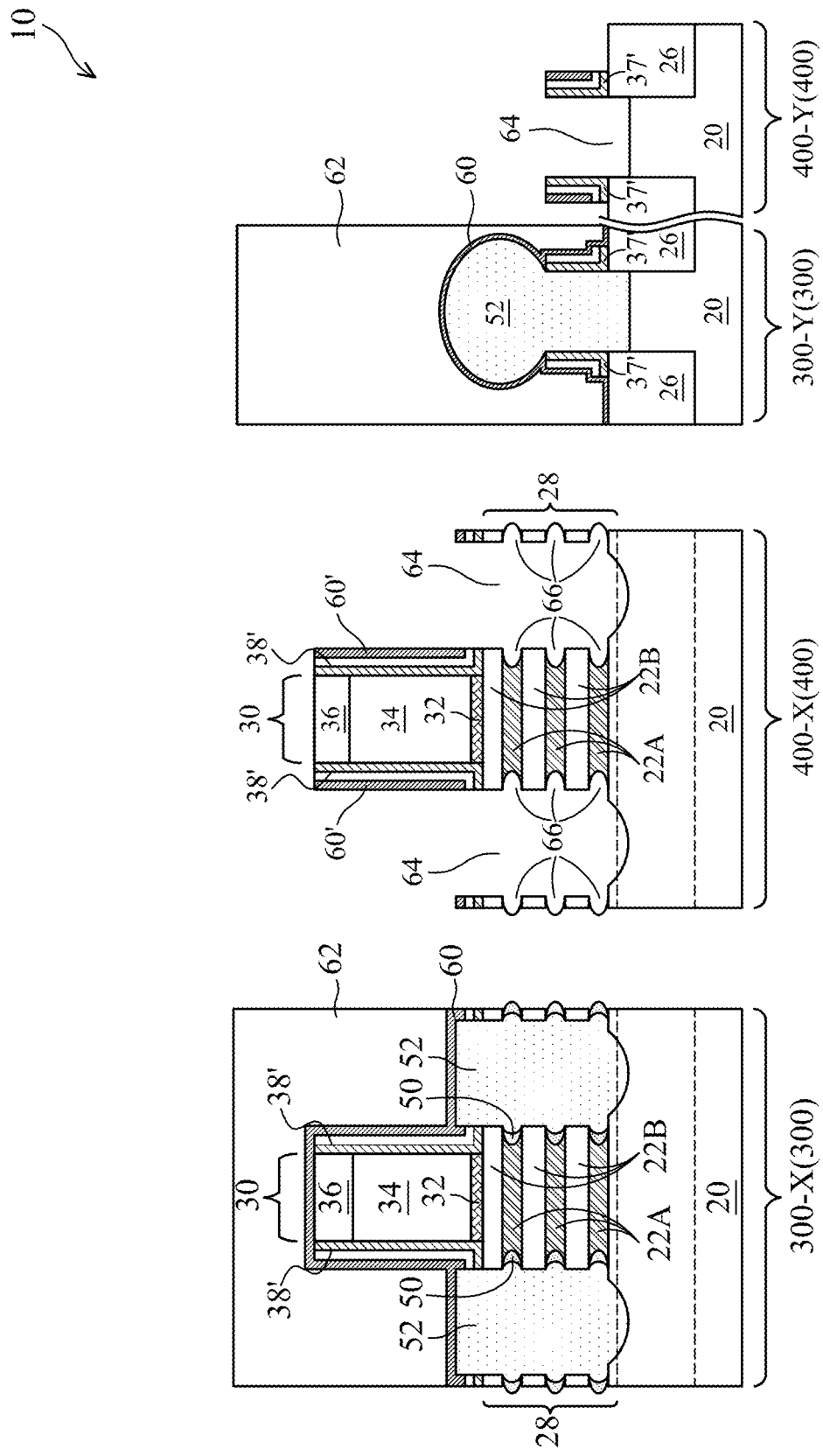

Referring to FIG. 13, sacrificial semiconductor layers 22A are laterally recessed to form lateral recesses 66, which are recessed from the edges of the respective overlying and underlying nanostructures 22B. The respective process is illustrated as process 232 in the process flow 200 as shown in FIG. 31. The lateral recessing of sacrificial semiconductor layers 22A may be achieved through a wet etching process or an isotropic dry etching process.

Figure 14:
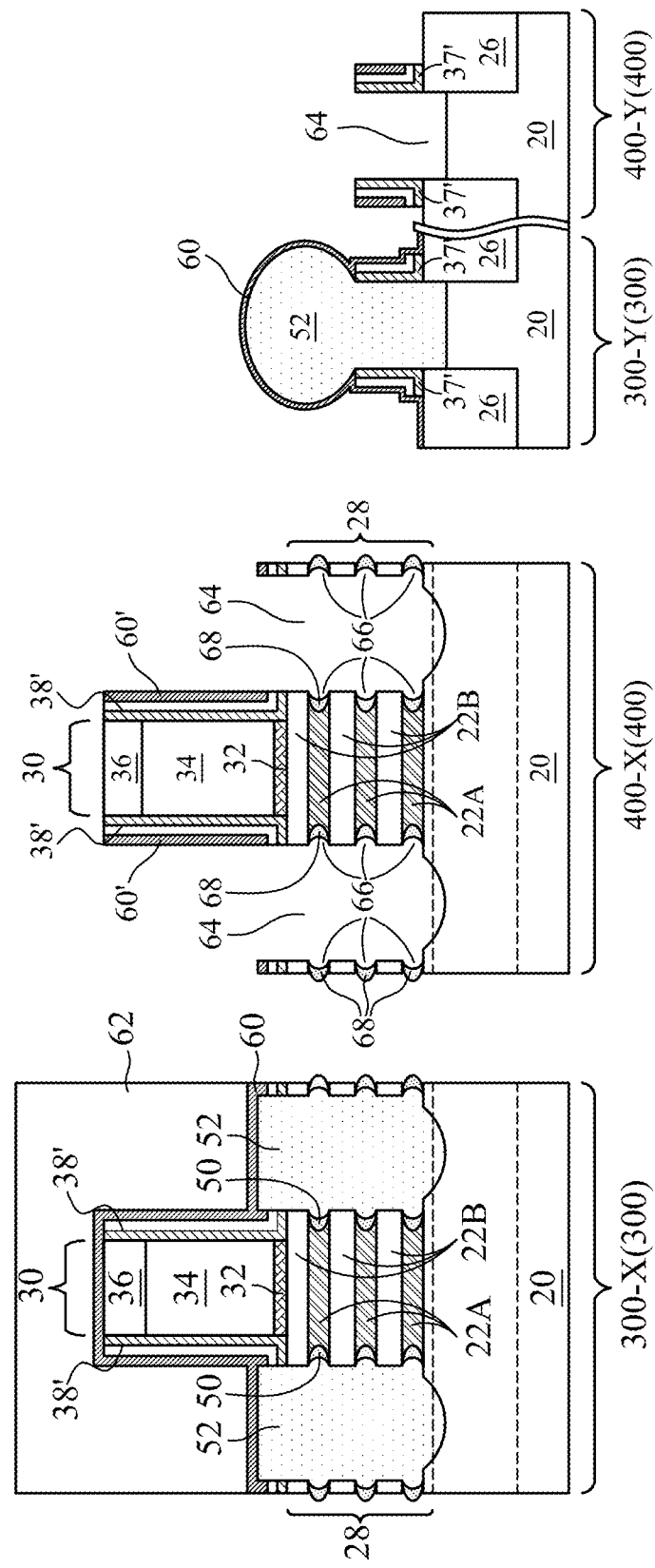

FIG. 14 illustrates the formation of inner spacers 68. The respective process is illustrated as process 234 in the process flow 200 as shown in FIG. 31. In accordance with some embodiments, the formation of inner spacers 68 includes depositing a dielectric layer, and then etching the dielectric layer to remove the portions of dielectric layer outside of lateral recesses 66.

A cleaning process may then be performed to prepare for the subsequent epitaxy. In accordance with some embodiments, the cleaning process may be performed using $H_2SO_4$, $H_2O_2$, and the like, followed by the rinsing using water.

Figure 15:
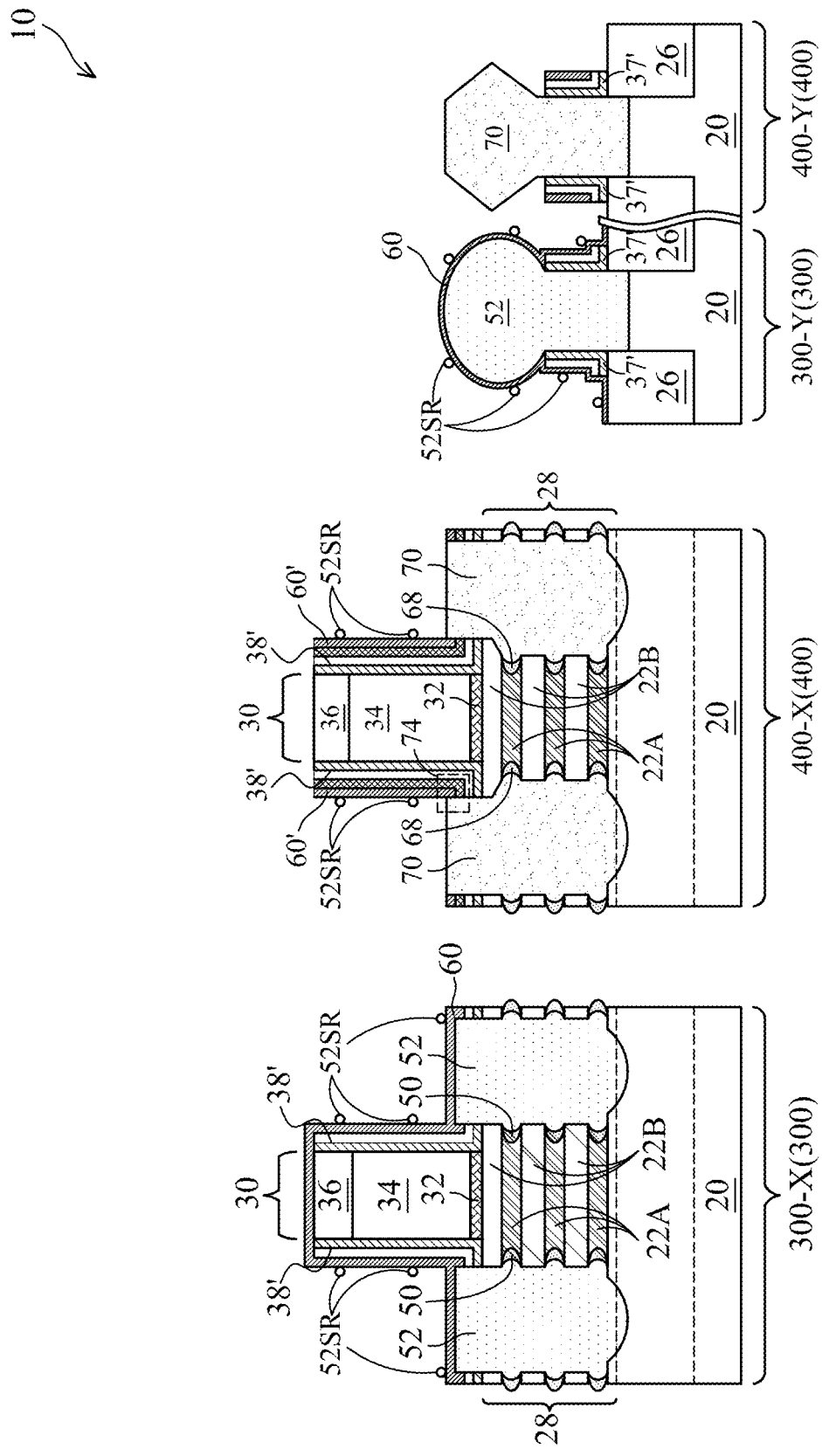

Referring to FIG. 15, epitaxial source/drain regions 70 are formed in recesses 64 and 66. The respective process is illustrated as process 236 in the process flow 200 as shown in FIG. 31. Depending on whether the resulting transistor in device region 400 is a p-type transistor or an n-type transistor, a p-type or an n-type impurity may be in-situ doped with the proceeding of the epitaxy. For example, when the resulting transistor is a p-type Transistor, silicon germanium boron (SiGeB), silicon boron (SiB), or the like may be grown. Conversely, when the resulting transistor is an n-type Transistor, silicon phosphorous (SiP), silicon carbon phosphorous (SiCP), SiAs, or the like, or combinations thereof may be grown. In accordance with some embodiments, source/drain regions 52 are p-type regions, while source/drain regions 70 are n-type regions, or vice versa. In accordance with alternative embodiments, both of source/drain regions 52 and 70 are n-type regions or p-type regions, while they are different from each other, for example, in the composition, doping concentration, and/or the like. In the epitaxy process, some small portions 52SR of the semiconductor material may be grown, and may be minimized due to the high growth selectivity.

The Dummy sidewall spacers 60' in device region 400 and dummy spacer layer 60 in device region 300 are then removed. The respective process is illustrated as process 238 in the process flow 200 as shown in FIG. 31. Gate spacers 38' in device region 400 and gate spacers 38' in device region 300, on the other hand, are left unremoved. After the removal process, a recess will be formed in regions 74, which recess is left by a portion of the dummy sidewall spacers 60' that was previously formed between the top portions of source/drain regions 70 and the respective nearest gate spacers 38'.

Figure 16:
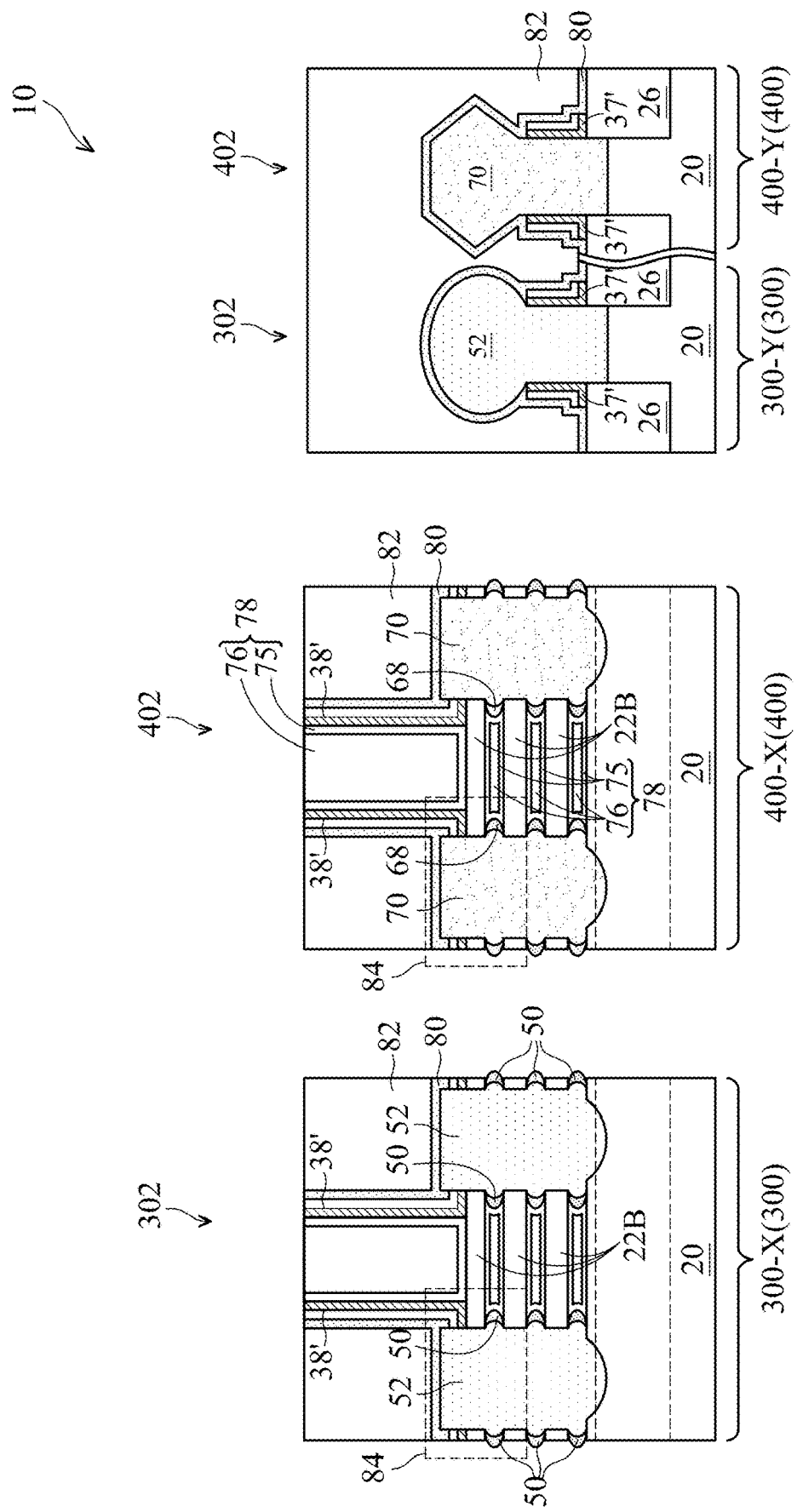

Referring to FIG. 16, Contact Etch Stop Layer (CESL) 80 and Inter-Layer Dielectric (ILD) 82 are formed. CESL 80 may be formed of silicon oxide, silicon nitride, silicon carbo-nitride, or the like, and may be formed using CVD, ALD, or the like. ILD 82 may include a dielectric material formed using, for example, FCVD, spin-on coating, CVD, or the like deposition method. ILD 82 may be formed of an oxygen-containing dielectric material, which may be silicon oxide, phospho-silicate glass (PSG), borosilicate glass (BSG), boron-doped phospho-silicate glass (BPSG), fluorine-doped silicate glass (FSG), or the like. A planarization process such as a CMP process or a mechanical grinding process may be performed to level the top surfaces of ILD 82, dummy gate stacks 30, and gate spacers 38' with each other.

Next, dummy gate stacks 30 are replaced with replacement gate stacks. The respective process is illustrated as process 240 in the process flow 200 as shown in FIG. 31. In the replacing process, dummy gate electrodes 34, hard masks 36, and dummy gate dielectrics 32 are removed in one or more etching processes, so that recesses are formed. In accordance with some embodiments, dummy gate electrodes 34 and dummy gate dielectrics 32 are removed through an anisotropic or isotropic dry etch process.

Next, sacrificial layers 22A are removed to extend the recesses between nanostructures 22B. Sacrificial layers 22A may be removed by performing an isotropic etching process such as a wet etching process using etchants which are selective to the materials of sacrificial layers 22A, while nanostructures 22B, substrate 20, and STI regions 26 remain un-etched as compared to sacrificial layers 22A. In accordance with some embodiments in which sacrificial layers 22A include, for example, SiGe, and nanostructures 22B include, for example, Si or SiC, the etching chemical for removing sacrificial layers 22A may include tetramethylammonium hydroxide (TMAH), ammonium hydroxide ($NH_4OH$).

FIG. 16 further illustrates the formation of replacement gate stacks 78, which include replacement gate dielectrics 75 and replacement gate electrodes 76. In accordance with some embodiments, each of gate dielectrics 75 includes an interfacial layer and a high-k dielectric layer on the interfacial layer. The interfacial layer may be formed of or comprises silicon oxide, which may be deposited through a conformal deposition process such as ALD or CVD. In accordance with some embodiments, the high-k dielectric layers comprise one or more dielectric layers. For example, the high-k dielectric layer(s) may include a metal oxide or a silicate of hafnium, aluminum, zirconium, lanthanum, manganese, barium, titanium, lead, and combinations thereof.

In the formation of replacement gate electrodes 76, conductive layers are first formed on the high-k dielectric layer, and fill the remaining portions of the recesses. Gate electrodes 76 may include a metal-containing material such as TiN, TaN, TiAl, TiAlC, cobalt, ruthenium, aluminum, tungsten, combinations thereof, and/or multilayers thereof. Gate dielectrics 75 and gate electrodes 76 also fill the spaces between adjacent ones of nanostructures 22B. After the filling of the recesses, a planarization process such as a CMP process or a mechanical grinding process is performed to remove the excess portions of the gate dielectrics 75 and the material of gate electrodes 76, which excess portions are over the top surface of ILD 82. Gate electrodes 76 and gate dielectrics 75 are collectively referred to as gate stacks 78 of the resulting nano-FETs. GAA transistors 302 and 402 are thus formed in device regions 300 and 400, respectively.

Figure 17A:
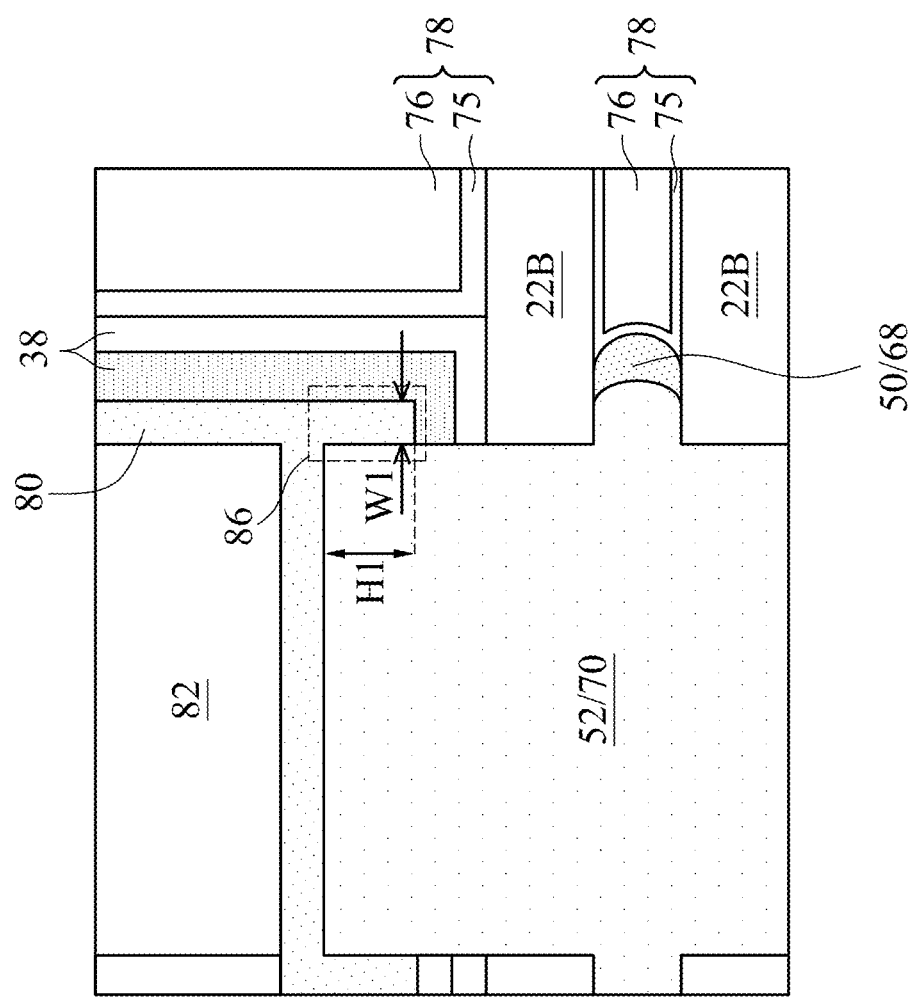

FIG. 17A illustrates a magnified view of region 84 as shown in FIG. 16, wherein region 84 is a part of transistor 302 or 402. As shown in FIG. 17A, due to the removal of the dummy sidewall spacers 40', a space is yielded in region 86, which region correspond to the region 58 in FIG. 10 and/or the regions 74 in FIG. 15. Source/drain regions 52 and/or 70 (marked as 52/70) are thus spaced apart from gate spacers 38' by the respective portions of CESL 80. The width W1 of region 86 is determined by the thicknesses of the removed dummy sidewall spacers. For example, width W1 may be smaller than about 4 nm, and may be in the range between about 2 nm and about 4 nm. Width W1 may also be in the range between about 1 nm and about 2 nm. The height H1 of region 86 is determined by the height of the source/drain regions 52/70.

In accordance with some embodiments, as shown in FIG. 17A, CESL 80 fully fills the space in region 86. In accordance with alternative embodiments, the height H1 is significantly greater than width W1, for example, with ratio H1/W1 being greater than 2, greater than 5, greater than 10, or even greater. Region 86 is thus tall and narrow. In accordance with some embodiments, the bottom portions of dummy sidewall spacers 40' or 60' (referred to as 40'/60') in FIGS. 10 and 15 are unable to be fully removed. In accordance with alternative embodiments, CESL 80 is unable to fill into lower portions of the spaces left by the removed dummy sidewall spacers 40'/60'. FIGS. 17B, 17C, and 17D illustrate the cross-sectional views of regions 86 in accordance with some embodiments. In FIG. 17B, CESL 80 is unable to fill into the bottom portion of the space left by the removed dummy sidewall spacer 40'/60', hence forming air spacer 88. In FIG. 17C, a bottom portion of dummy sidewall spacer 40'/60' remains unremoved, and air spacer 88 is formed between dummy sidewall spacer 40'/60' and CESL 80. In FIG. 17D, a bottom portion of dummy sidewall spacer 40'/60' is left unremoved, and CESL 80 contacts the remaining portion of dummy sidewall spacer 40'/60'

Figure 19:
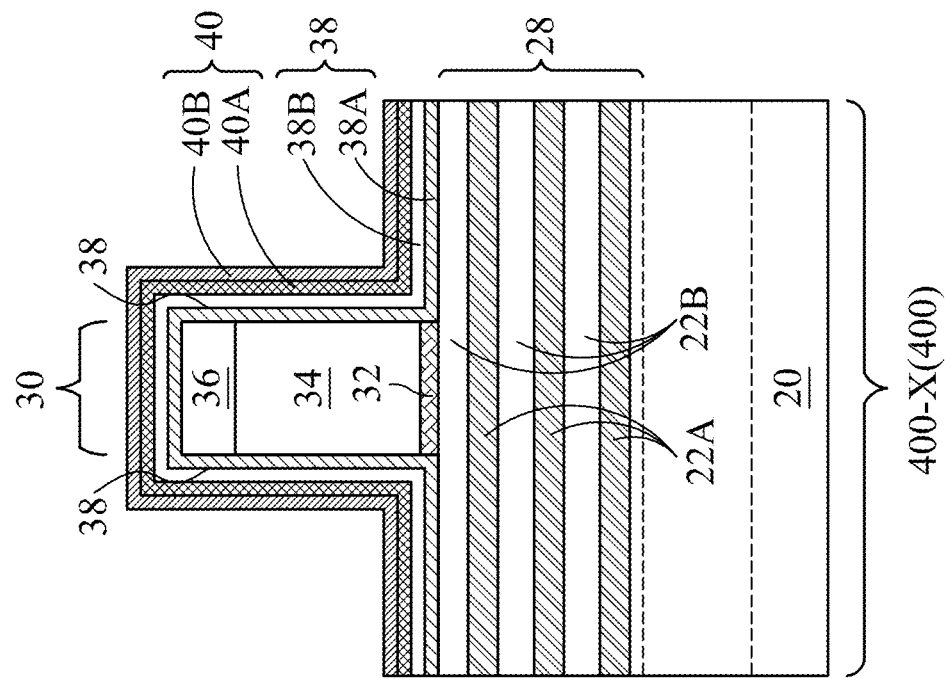
Figure 19:
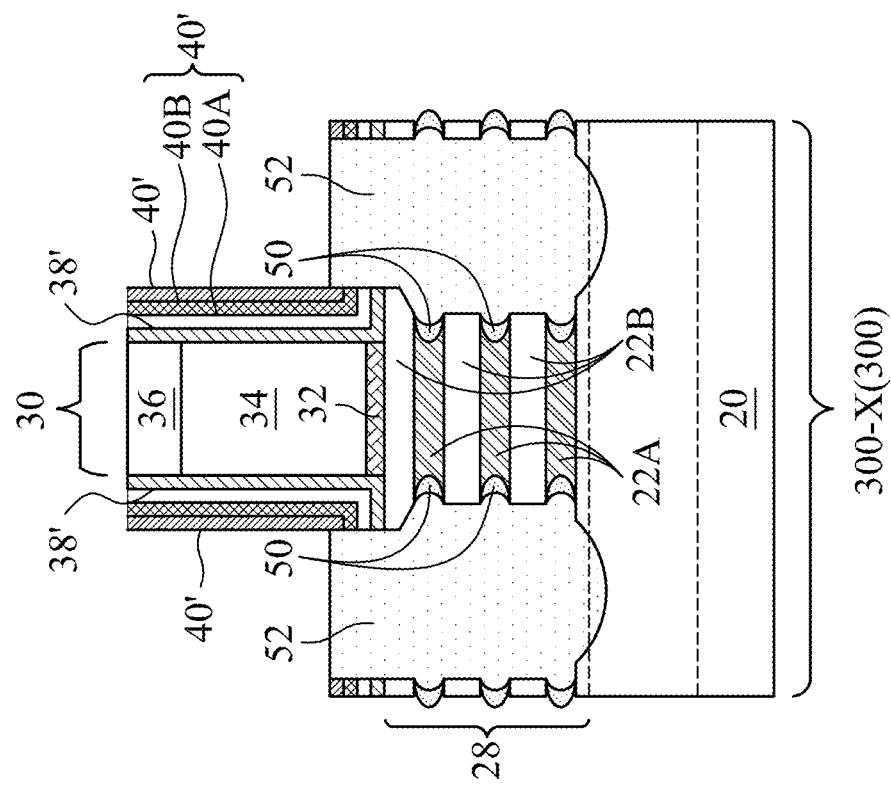
Figure 20:
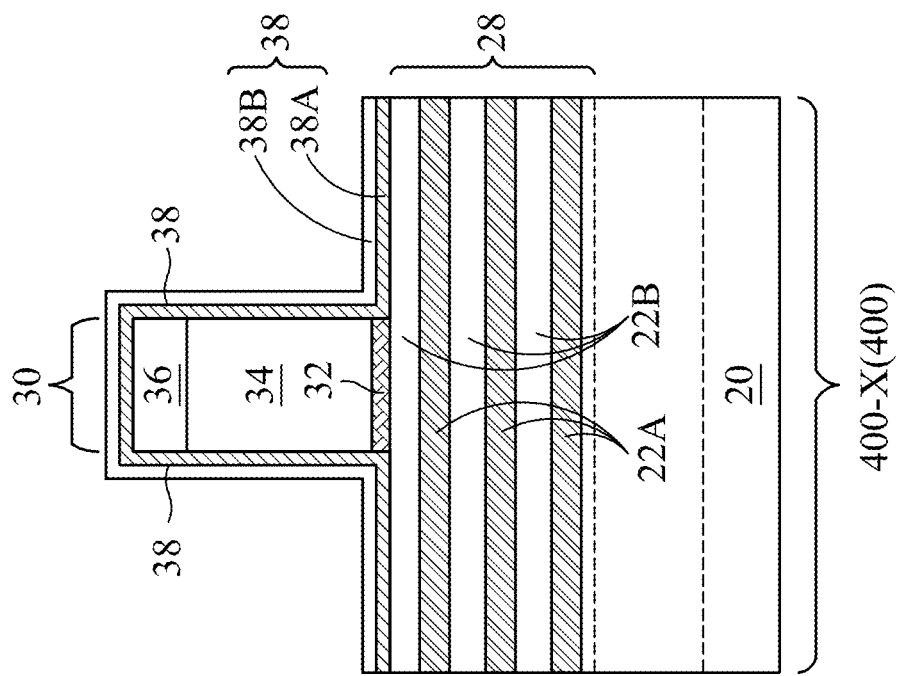
Figure 20:
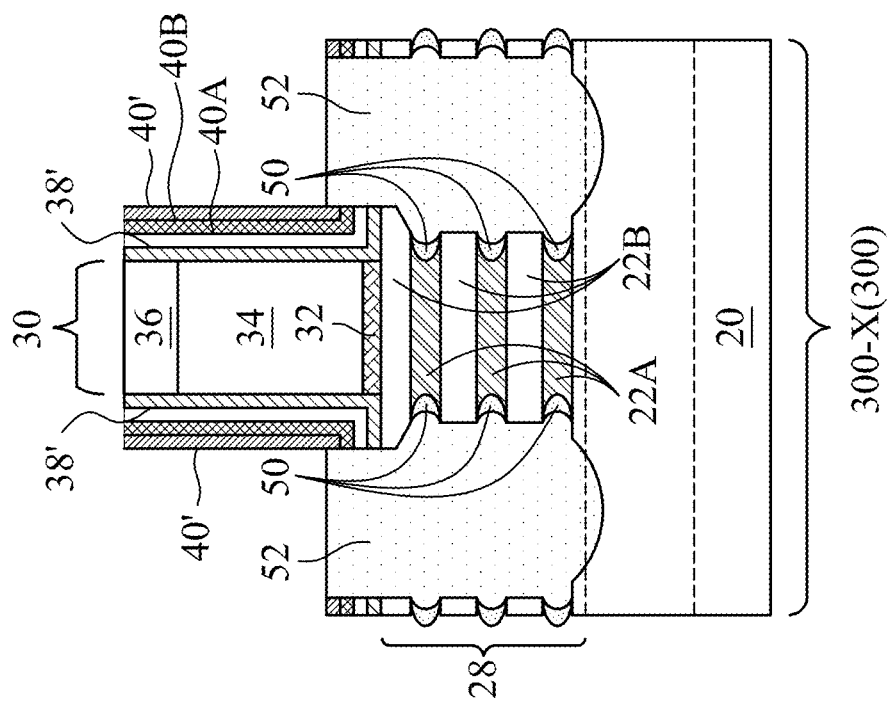

FIGS. 18-20 illustrate the cross-sectional views of intermediate stages in the formation of transistors in accordance with alternative embodiments of the present disclosure. Unless specified otherwise, the materials and the formation processes of the components in these embodiments are essentially the same as the like components denoted by like reference numerals in the preceding embodiments shown in FIGS. 1-16, 17A, 17B, 17C, and 17D. The details regarding the formation processes and the materials of the components shown in FIGS. 18-20 (and FIGS. 21-29) may thus be found in the discussion of the preceding embodiments. In these figures, cross-sections 300-X and 400-X are illustrated, and the cross-sections 300-Y and 400-Y are not illustrated.

The initial steps of these embodiments are essentially the same as shown in FIGS. 1 through 4. Next, as shown in FIG. 18, a multi-layer dummy spacer layer 40 is deposited. In accordance with some embodiments, the multi-layer dummy spacer layer 40 includes lower layer 40A, and upper layer 40B over lower layer 40A. Upper layer 40B is a metal-containing dielectric layer, which may be a metal oxide layer. The material of upper layer 40B may be selected from aluminum oxide, titanium oxide, zirconium oxide, hafnium zirconium oxide, or the like, or combinations thereof. The material of lower layer 40A is different from the material of upper layer 40B.

Furthermore, the upper layer 40B may have a higher growth selectivity (in response to the epitaxy for source/drain regions) than the lower layer 40A, while the lower layer 40A may have a better adhesion to the underlying layers than the upper layer 40B. In accordance with some embodiments, lower layer 40A is formed of or comprises silicon oxide. In accordance with alternative embodiments, lower layer 40A is also formed of a metal-containing material, which may also be selected from the above-discussed list of candidate materials for forming upper layer 40B. In accordance with other embodiments, there may be (or may not be) other layers between lower layer 40A and upper layer 40B. With the formation of lower layer 40A, upper layer 40B may be thinner without sacrificing growth selectivity, and the total thickness of dummy spacer layer 40 may fall into the same range as discussed, such as smaller than about 4 nm, and may be in the range between about 2 nm and about 4 nm, or in the range between about 1 nm and about 2 nm.

Next, the processes as discussed referring to FIG. 6-10 are performed. FIG. 19 illustrates an intermediate structure after the formation of source/drain regions 52. Dummy spacer layer 40 is then removed, and the resulting structure is shown in FIG. 20. The processes as discussed referring to FIG. 11-16 are then performed, and source/drain regions 70 (FIG. 16) are formed in device region 400. The final transistors may be essentially the same as shown in FIGS. 16, 17A, 17B, 17C, and 17D. In accordance with these embodiments, the remaining portions of dummy sidewall spacers 40'/60' (FIGS. 17C and 17D) are also dual layers including lower layers closer to gate stacks 78, and upper layers farther away from gate stacks 78.

Figure 21:
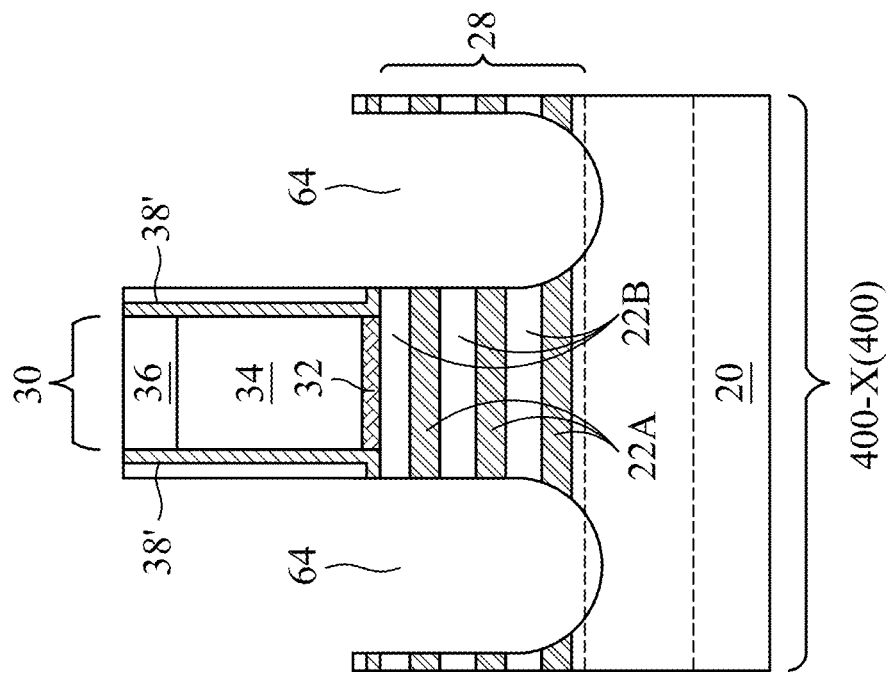
FIGS. 21-26 illustrate the cross-sectional views of intermediate stages in the formation of GAA transistors in accordance with alternative embodiments.
Figure 21:
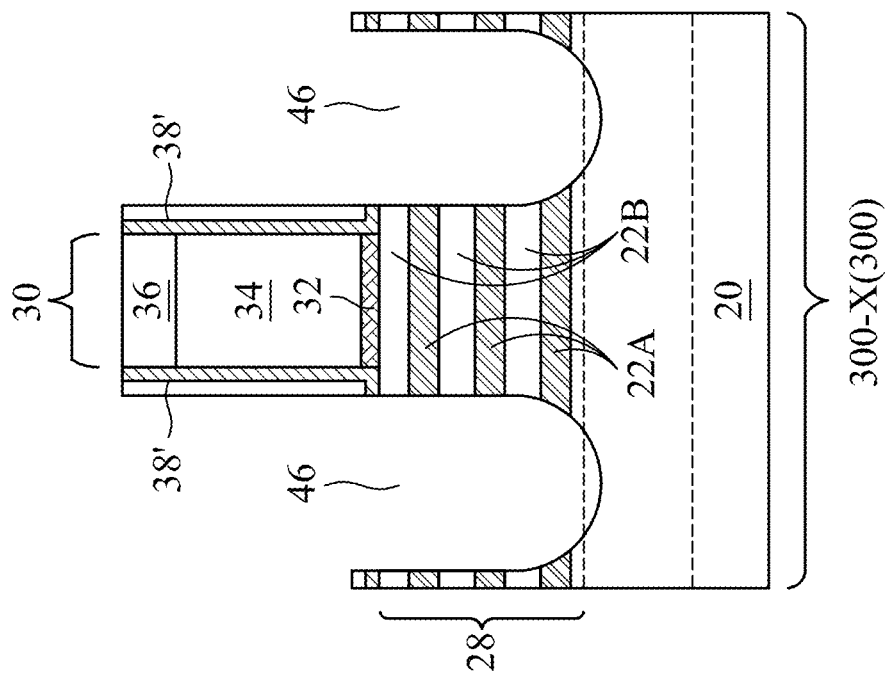

FIGS. 21 through 26 illustrate the intermediate stages in the formation of transistors in accordance with alternative embodiments of the present disclosure. These embodiments are similar to the previously discussed embodiments, except that dummy spacer layers 40 and 60 are formed after the formation of trenches for filling source/drain regions. The initial formation processes and structures are the same as shown in FIGS. 1-5, wherein gate spacers 38' are formed, while dummy spacer layer has not been formed. Next, as shown in FIG. 21, without forming dummy sidewall spacer layer, trenches 46 and 64 are formed to penetrate through protruding semiconductor fins 28. In accordance with some embodiments, trenches 46 and 64 are formed in a same etching process(es).

Figure 22:
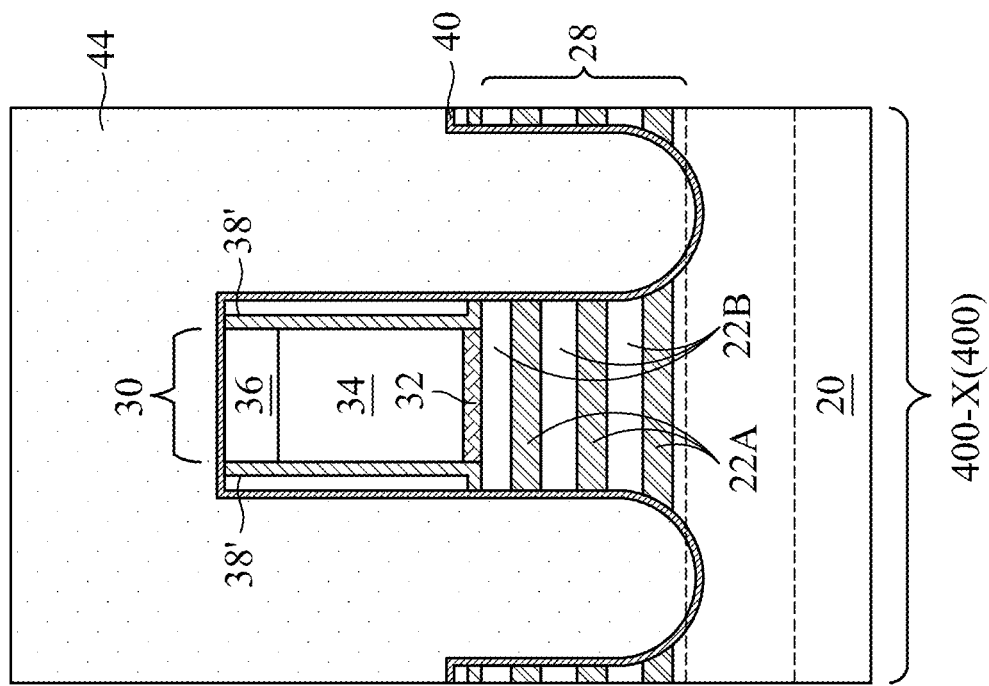
Figure 22:
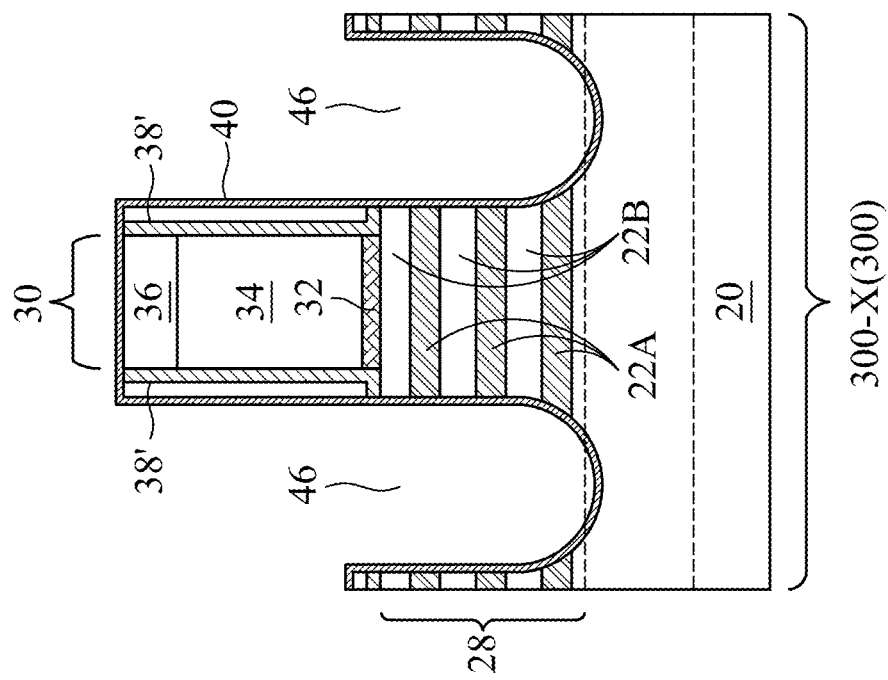

FIG. 22 illustrates the deposition of dummy spacer layer 40. The material and the formation process of dummy spacer layer 40 have been discussed referring to FIG. 6, and are not repeated herein. Dummy spacer layer 40 extends into recesses 46 and 64. Etching mask 44, which may include a photoresist, is then formed.

Figure 23:
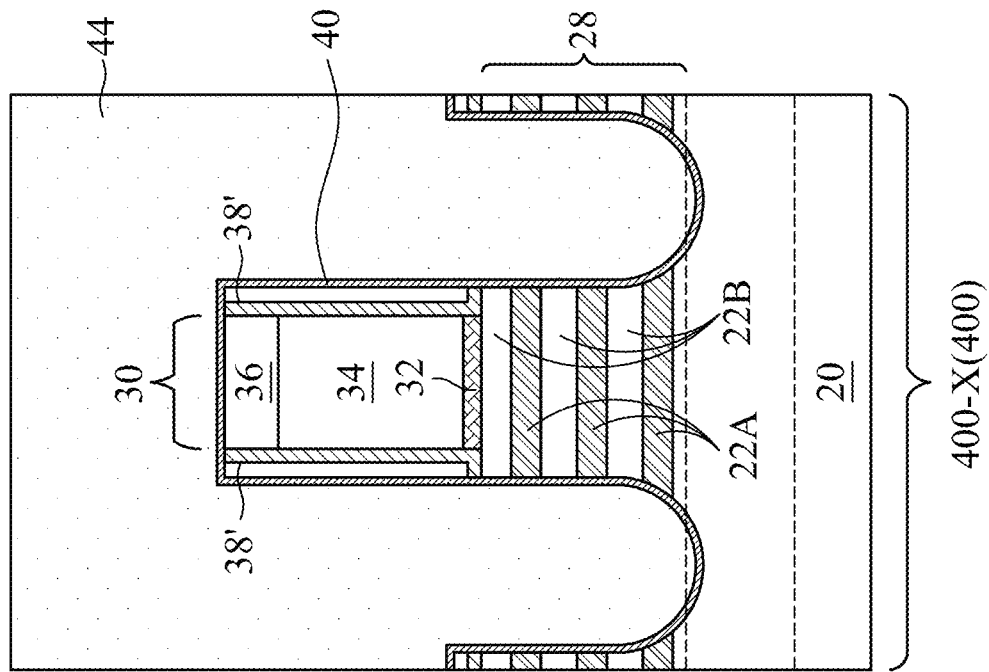
Figure 23:
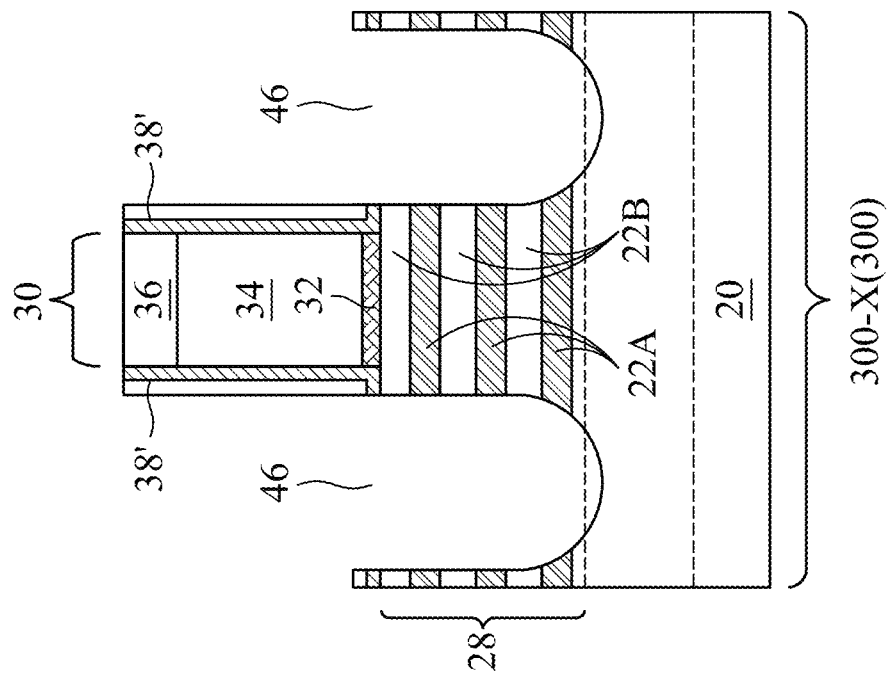
Figure 24:
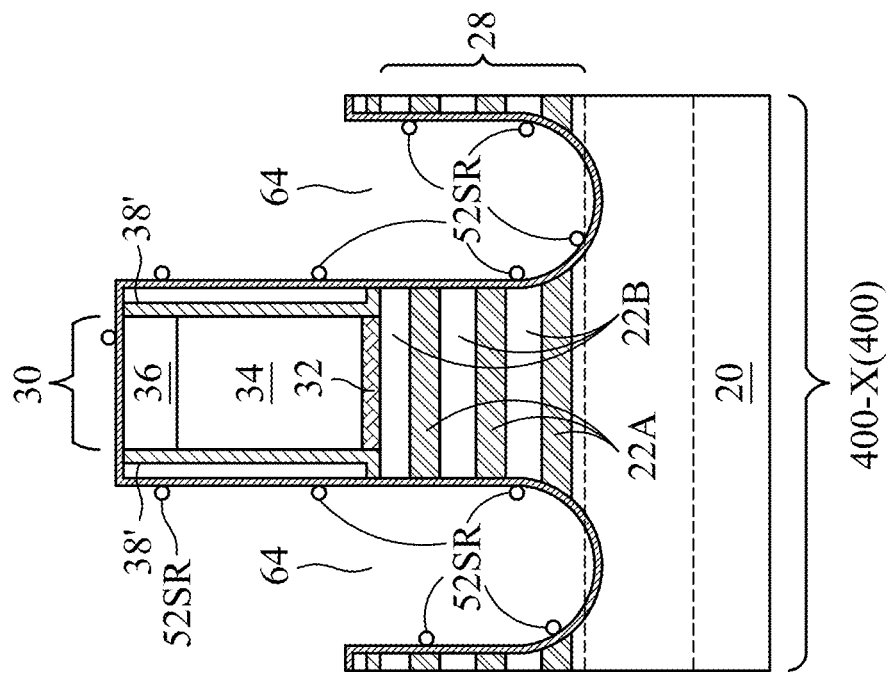
Figure 24:
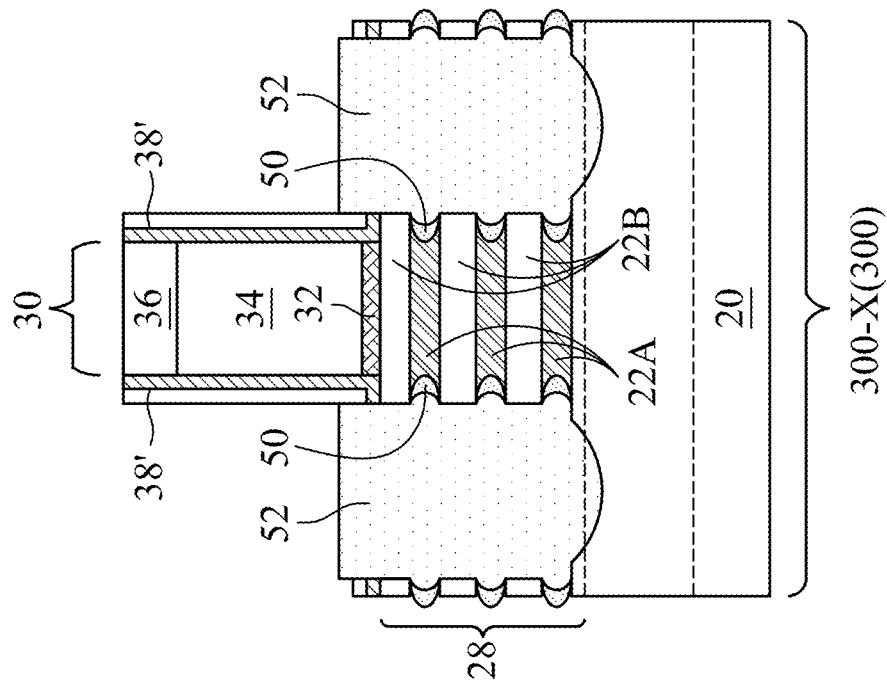

The dummy spacer layer 40 is then removed from device region 300 through etching. The resulting structure is shown in FIG. 23. Subsequently, the processes as shown in FIGS. 8 through 10 are performed to form inner spacers 50 and source/drain regions 52 in device region 300. The resulting structure is shown in FIG. 24. Some portions 52SR of the semiconductor material for source/drain regions 52 may be formed on the remaining dummy spacer layer 40 in device region 400. Due to the selection of the material of dummy spacer layer 40, however, the sizes of portions 52SR are minimized. The remaining portions of dummy spacer layer 40 is then removed through etching.

Figure 25:
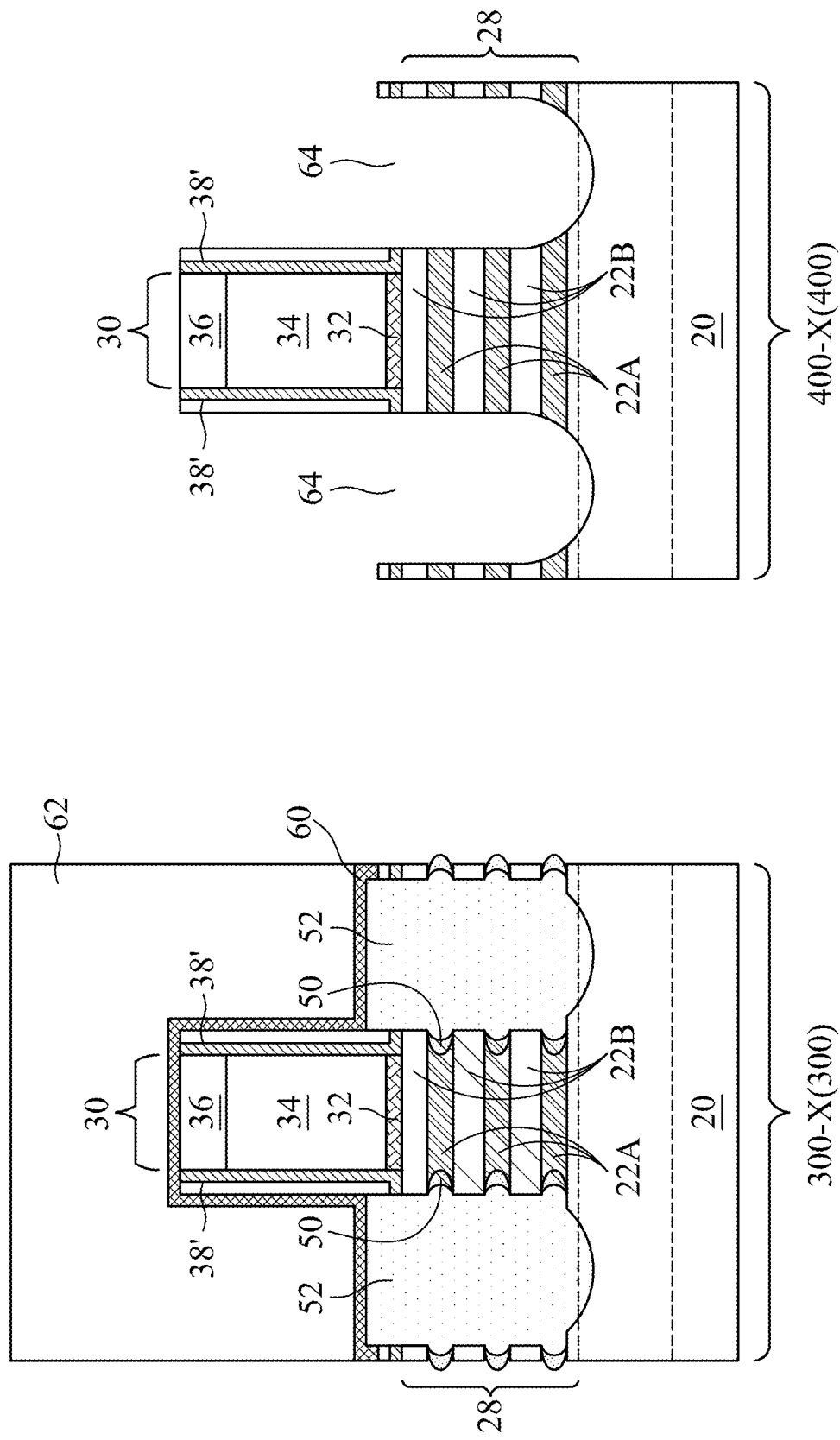

FIG. 25 illustrates the formation of dummy spacer layer 60 in device region 300, which dummy spacer layer 60 conformally extends into recesses 64. The formation process may include depositing dummy spacer layer 60 in device regions 300 and 400, forming patterned etching mask 62 to cover device region 300, and removing the portions of dummy spacer layer 60 in device region 400.

Figure 26:
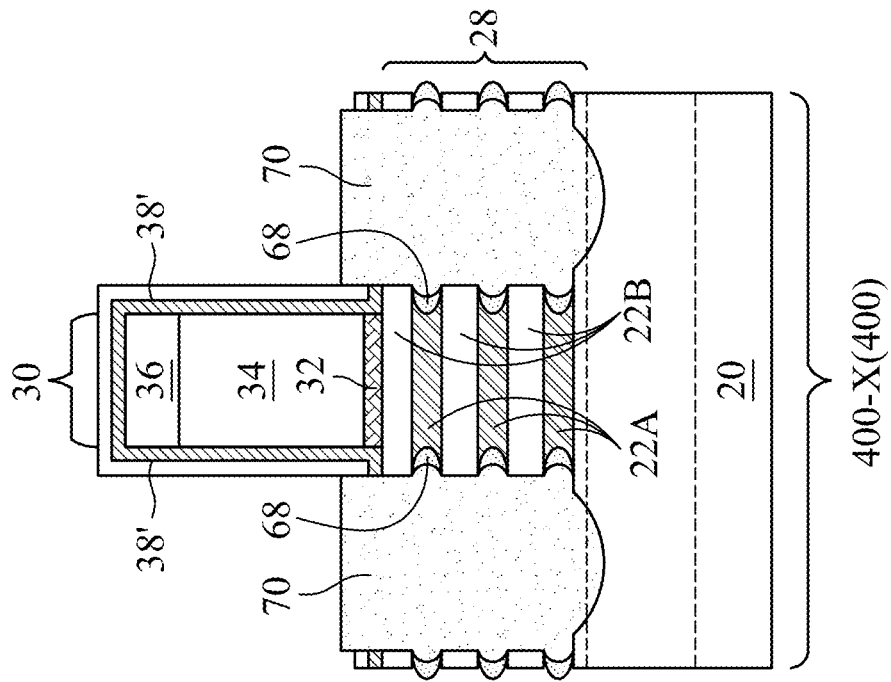
Figure 26:
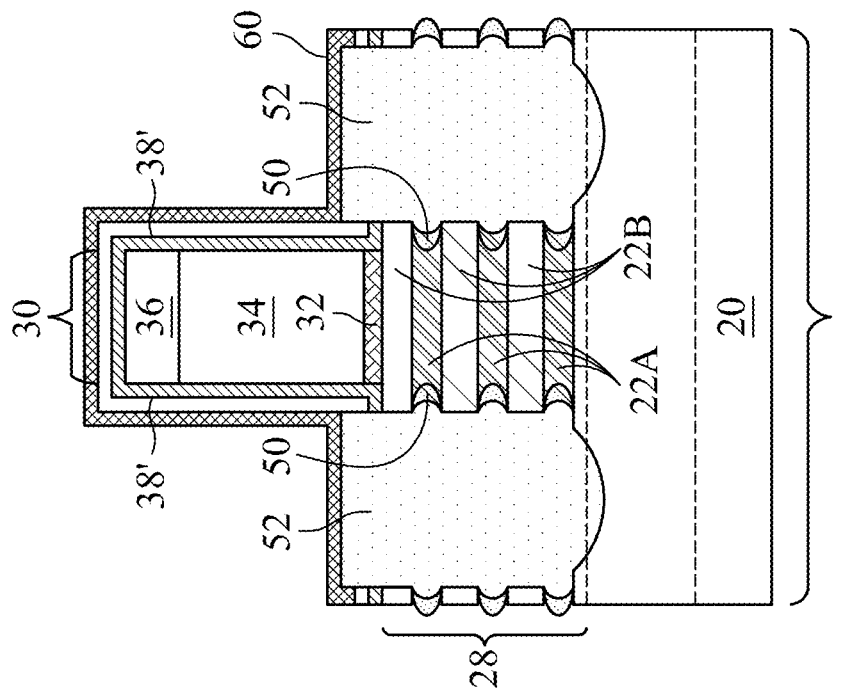

The processes as shown in FIGS. 13-15 are then performed, and the details are not repeated herein. The resulting structure is shown in FIG. 26. The Source/drain regions 52 and 70, rather than contacting dummy sidewalls spacers 60' as shown in FIG. 15, are in physical contact with the sidewalls of gate spacers 38' in accordance with these embodiments.

Figure 27:
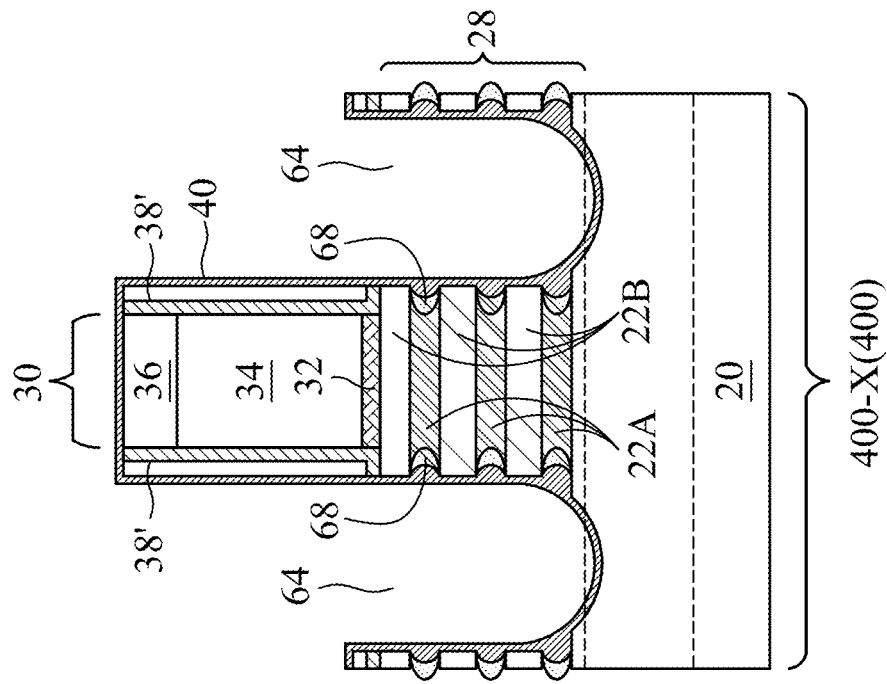
FIGS. 27-29 illustrate the cross-sectional views of intermediate stages in the formation of GAA transistors in accordance with alternative embodiments.
Figure 27:
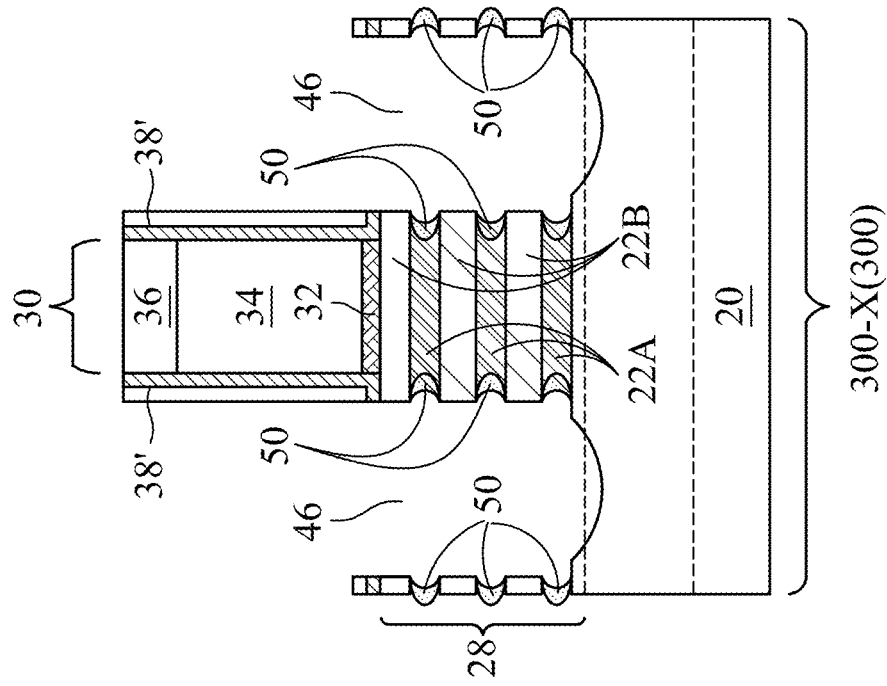
Figure 28:
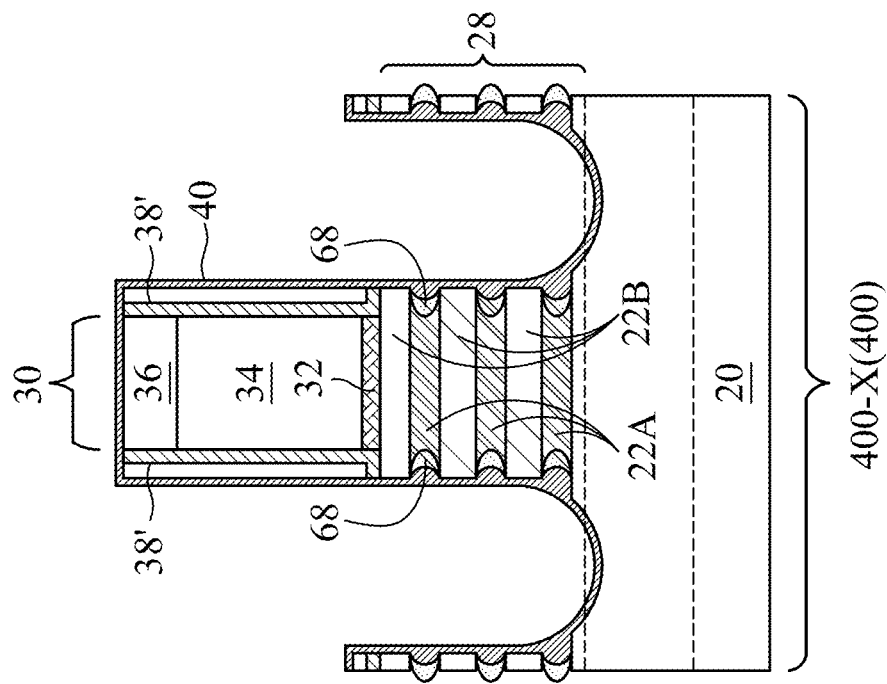
Figure 28:
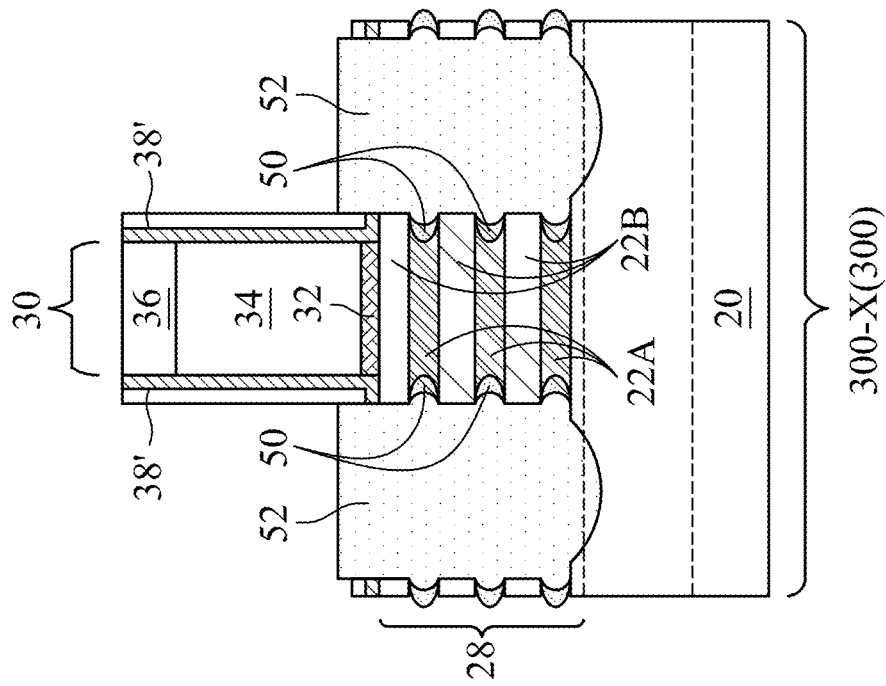
Figure 29:
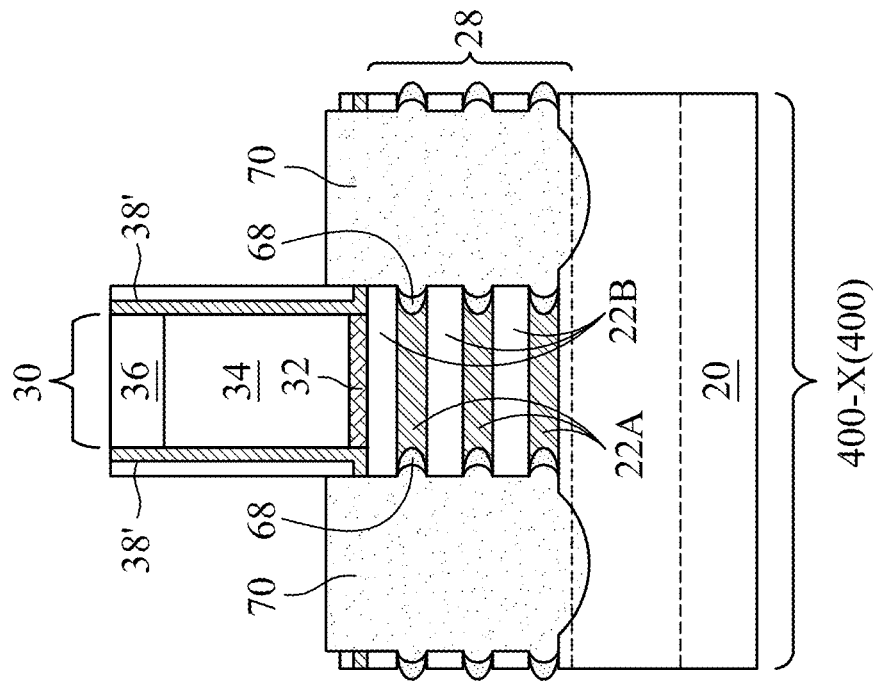
Figure 29:
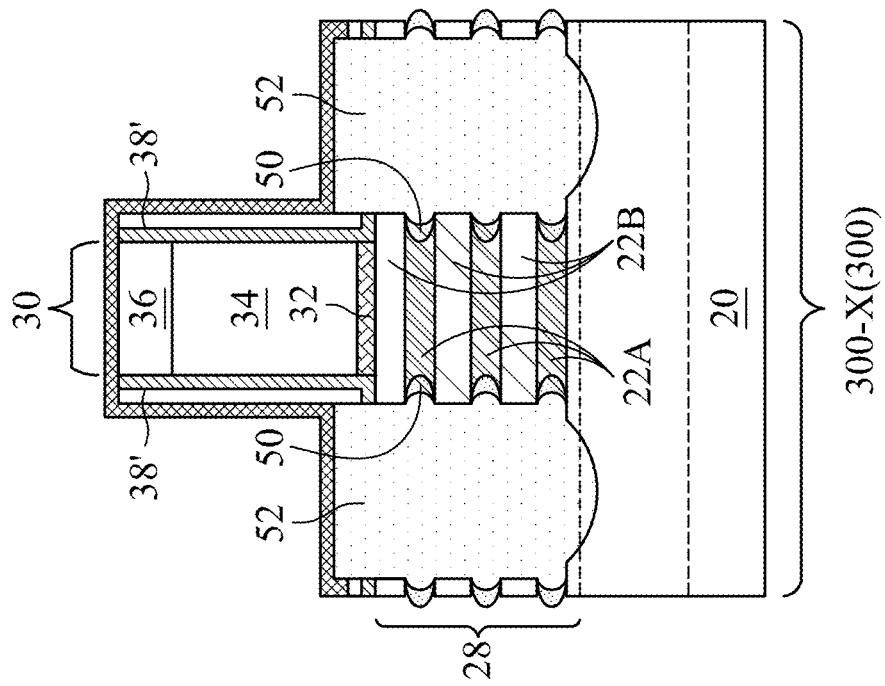

FIGS. 27-29 illustrate some intermediate stages in the formation of transistors in accordance with alternative embodiments. These embodiments are similar to the embodiments shown in FIGS. 21-26, except that in the embodiments shown in FIGS. 21-26, dummy spacer layers 40 and 60 are formed before the formation of the respective inner spacers 50 and 68, while in the embodiments shown in FIGS. 27-29, dummy spacer layers 40 and 60 are formed after the formation of the respective inner spacers 50 and 68. Accordingly, dummy spacer layers 40 and 60 extend into the respective lateral recesses. The inner spacers 50 and 68 may be formed in common formation processes. Next, as shown in FIG. 27, dummy spacer layer 40 extends into lateral recesses aside of inner spacers 68. FIG. 28 illustrates the formation of source/drain regions 52. The subsequent processes are similar to the embodiments shown in FIGS. 25-26, and the resulting structure is shown in FIG. 29.

The embodiments of the present disclosure have some advantageous features. By forming dummy spacer layers and dummy sidewall spacers using selected metal-containing materials, the dummy spacer layers and dummy sidewall spacers may be formed very thin without sacrificing their growth selectivity in the formation of epitaxy semiconductor materials. The reduction in the thickness of these layer results in the reduction of the pitches of transistors.

In accordance with some embodiments of the present disclosure, a method comprises forming a first gate stack over a first semiconductor region; depositing a spacer layer on the first gate stack; depositing a dummy spacer layer on the spacer layer, wherein the dummy spacer layer comprises a metal-containing material; performing an anisotropic etching process on the dummy spacer layer and the spacer layer to form a gate spacer and a dummy sidewall spacer, respectively; etching the first semiconductor region to form a recess extending into the first semiconductor region, wherein the etching the first semiconductor region is performed using the first gate stack, the gate spacer, and the dummy sidewall spacer as an etching mask; epitaxially growing a source/drain region in the recess; and after the source/drain region is grown, removing the dummy sidewall spacer.

In an embodiment, the depositing the dummy spacer layer comprises depositing a metal oxide layer. In an embodiment, the depositing the metal oxide layer comprises depositing an oxide selected from aluminum oxide, titanium oxide, zirconium oxide, hafnium zirconium oxide, and combinations thereof. In an embodiment, the method further comprises depositing a contact etch stop layer contacting the gate spacer, wherein the contact etch stop layer extends into a space between the source/drain region and the gate spacer. In an embodiment, the dummy spacer layer has a thickness smaller than about 4 nm. In an embodiment, the method further comprises forming a second gate stack over a second semiconductor region, wherein the spacer layer and the dummy spacer layer further extend on the second gate stack, and wherein when the source/drain region is epitaxially grown, the second gate stack and the second semiconductor region are covered by the dummy spacer layer.

In an embodiment, the first semiconductor region comprises a plurality of nanostructures and a plurality of sacrificial layers stacked and arranged alternatingly, and the method further comprises after the recess is formed, laterally recessing the plurality of sacrificial layers to form lateral recesses; forming inner spacers in the lateral recesses; and replacing the sacrificial layers with a replacement gate stack. In an embodiment, the method further comprises depositing a non-metal-containing dummy spacer layer between the dummy spacer layer and the spacer layer. In an embodiment, the non-metal-containing dummy spacer layer comprises silicon oxide.

In accordance with some embodiments of the present disclosure, a method comprises forming a first semiconductor stack and a second semiconductor stack in a first device region and a second device region, respectively, wherein each of the first semiconductor stack and the second semiconductor stack comprises a plurality of nanostructures and a plurality sacrificial layers stacked and arranged alternatingly; depositing a first gate stack and a second gate stack on sidewalls and top surfaces of a first portion of the first semiconductor stack and the second semiconductor stack, respectively; forming first gate spacers and second gate spacers on sidewalls of the first gate stack and the second gate stack, respectively; depositing a dummy spacer layer comprising a first part and a second part in the first device region and the second device region, respectively, wherein the dummy spacer layer comprises a metal; removing the first part of the dummy spacer layer; etching a second portion of the first semiconductor stack to form a recess; and performing a first epitaxy process to grow a first source/drain region in the recess, wherein when the first source/drain region is grown, the second part of the dummy spacer layer covers the second semiconductor stack, and is exposed.

In an embodiment, the method further comprises, after the first epitaxy process, removing the second part of the dummy spacer layer. In an embodiment, the dummy spacer layer is deposited before the second portion of the first semiconductor stack is etched. In an embodiment, the method further comprises patterning the first part of the dummy spacer layer to form a dummy spacer, wherein during the first epitaxy process, the dummy spacer layer is exposed. In an embodiment, the dummy spacer layer is deposited after the second portion of the first semiconductor stack is etched.

In an embodiment, the method further comprises laterally recessing the plurality sacrificial layers of the first semiconductor stack to form lateral recesses; and forming inner spacers in the lateral recesses, wherein the dummy spacer layer is deposited before the inner spacers are formed. In an embodiment, the method further comprises laterally recessing the plurality sacrificial layers of the first semiconductor stack to form lateral recesses; and forming inner spacers in the lateral recesses, wherein the dummy spacer layer is deposited after the inner spacers are formed. In an embodiment, the depositing the dummy spacer layer comprises deposing a first sub-layer as a metal-free layer; and depositing a second sub-layer over the first sub-layer, wherein the second sub-layer comprising the metal.

In accordance with some embodiments of the present disclosure, a method comprises depositing a first gate stack and a second gate stack over a first transistor region and a second transistor region, respectively; epitaxially growing a first source/drain region in the first transistor region for a first transistor, wherein when the first source/drain region is grown, a first metal oxide hard mask covers the second transistor region; and epitaxially growing a second source/drain region in the second transistor region for a second transistor, wherein when the second source/drain region is grown, a second metal oxide hard mask covers the first transistor region. In an embodiment, when the first source/drain region is grown, a dummy sidewall spacer is on a gate stack of the first transistor, with the first source/drain region being grown to contact the dummy sidewall spacer, and wherein the dummy sidewall spacer is formed by a same deposition process as the first metal oxide hard mask. In an embodiment, the method further comprises, after the first source/drain region is grown, performing an etching process to remove the dummy sidewall spacer and the first metal oxide hard mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first gate stack over a first semiconductor region;
   depositing a spacer layer on the first gate stack;
   depositing a dummy spacer layer on the spacer layer, wherein the dummy spacer layer comprises a metal-containing material;
   performing an anisotropic etching process on the dummy spacer layer and the spacer layer to form a gate spacer and a dummy sidewall spacer, respectively;
   etching the first semiconductor region to form a recess extending into the first semiconductor region, wherein the etching the first semiconductor region is performed using the first gate stack, the gate spacer, and the dummy sidewall spacer as an etching mask;
   epitaxially growing a source/drain region in the recess; and
   after the source/drain region is grown, removing the dummy sidewall spacer.

2. The method of claim 1, wherein the depositing the dummy spacer layer comprises depositing a metal oxide layer.

3. The method of claim 2, wherein the depositing the metal oxide layer comprises depositing an oxide selected from aluminum oxide, titanium oxide, zirconium oxide, hafnium zirconium oxide, and combinations thereof.

4. The method of claim 1 further comprising depositing a contact etch stop layer contacting the gate spacer, wherein the contact etch stop layer extends into a space between the source/drain region and the gate spacer.

5. The method of claim 1, wherein the dummy spacer layer has a thickness smaller than about 4 nm.

6. The method of claim 1 further comprising:
  forming a second gate stack over a second semiconductor region, wherein the spacer layer and the dummy spacer layer further extend on the second gate stack, and wherein when the source/drain region is epitaxially grown, the second gate stack and the second semiconductor region are covered by the dummy spacer layer.

7. The method of claim 1, wherein the first semiconductor region comprises a plurality of nanostructures and a plurality of sacrificial layers stacked and arranged alternatingly, and the method further comprises:
  after the recess is formed, laterally recessing the plurality of sacrificial layers to form lateral recesses;
  forming inner spacers in the lateral recesses; and
  replacing the sacrificial layers with a replacement gate stack.

8. The method of claim 1 further comprising depositing a non-metal-containing dummy spacer layer between the dummy spacer layer and the spacer layer.

9. The method of claim 8, wherein the non-metal-containing dummy spacer layer comprises silicon oxide.

10. A method comprising:
  forming a first semiconductor stack and a second semiconductor stack in a first device region and a second device region, respectively, wherein each of the first semiconductor stack and the second semiconductor stack comprises a plurality of nanostructures and a plurality of sacrificial layers stacked and arranged alternatingly;
  depositing a first gate stack and a second gate stack on sidewalls and top surfaces of a first portion of the first semiconductor stack and the second semiconductor stack, respectively;
  forming first gate spacers and second gate spacers on sidewalls of the first gate stack and the second gate stack, respectively;
  depositing a dummy spacer layer comprising a first part and a second part in the first device region and the second device region, respectively, wherein the dummy spacer layer comprises a metal;
  removing the first part of the dummy spacer layer;
  etching a second portion of the first semiconductor stack to form a recess; and
  performing a first epitaxy process to grow a first source/drain region in the recess, wherein when the first source/drain region is grown, the second part of the dummy spacer layer covers the second semiconductor stack, and is exposed.

11. The method of claim 10 further comprising, after the first epitaxy process, removing the second part of the dummy spacer layer.

12. The method of claim 10, wherein the dummy spacer layer is deposited before the second portion of the first semiconductor stack is etched.

13. The method of claim 12 further comprising patterning the first part of the dummy spacer layer to form a dummy spacer, wherein during the first epitaxy process, the dummy spacer layer is exposed.

14. The method of claim 10, wherein the dummy spacer layer is deposited after the second portion of the first semiconductor stack is etched.

15. The method of claim 14 further comprising:
  laterally recessing the plurality of sacrificial layers of the first semiconductor stack to form lateral recesses; and
  forming inner spacers in the lateral recesses, wherein the dummy spacer layer is deposited before the inner spacers are formed.

16. The method of claim 14 further comprising:
  laterally recessing the plurality of sacrificial layers of the first semiconductor stack to form lateral recesses; and
  forming inner spacers in the lateral recesses, wherein the dummy spacer layer is deposited after the inner spacers are formed.

17. The method of claim 10, wherein the depositing the dummy spacer layer comprises:
  deposing a first sub-layer as a metal-free layer; and
  depositing a second sub-layer over the first sub-layer, wherein the second sub-layer comprising the metal.

18. A method comprising:
  depositing a first gate stack and a second gate stack over a first transistor region and a second transistor region, respectively;
  epitaxially growing a first source/drain region in the first transistor region for a first transistor, wherein when the first source/drain region is grown, a first metal oxide hard mask covers the second transistor region; and
  epitaxially growing a second source/drain region in the second transistor region for a second transistor, wherein when the second source/drain region is grown, a second metal oxide hard mask covers the first transistor region.

19. The method of claim 18, wherein when the first source/drain region is grown, a dummy sidewall spacer is on a gate stack of the first transistor, with the first source/drain region being grown to contact the dummy sidewall spacer, and wherein the dummy sidewall spacer is formed by a same deposition process as the first metal oxide hard mask.

20. The method of claim 19 further comprising, after the first source/drain region is grown, performing an etching process to remove the dummy sidewall spacer and the first metal oxide hard mask.

* * * * *